United States Patent
Yamamoto et al.

(10) Patent No.: US 8,410,476 B2
(45) Date of Patent: Apr. 2, 2013

(54) ORGANIC ELECTROLUMINESCENT DISPLAY DEVICE AND PRODUCTION METHOD THEREOF

(75) Inventors: Emi Yamamoto, Osaka (JP); Kazuya Ishida, Osaka (JP); Hideki Uchida, Osaka (JP); Takeshi Hirase, Osaka (JP); Tohru Sonoda, Osaka (JP); Yuhki Kobayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 218 days.

(21) Appl. No.: 12/679,945

(22) PCT Filed: Aug. 1, 2008

(86) PCT No.: PCT/JP2008/063904
§ 371 (c)(1),
(2), (4) Date: Mar. 25, 2010

(87) PCT Pub. No.: WO2009/041158
PCT Pub. Date: Apr. 2, 2009

(65) Prior Publication Data
US 2010/0213449 A1      Aug. 26, 2010

(30) Foreign Application Priority Data

Sep. 28, 2007   (JP) .................................. 2007-255791

(51) Int. Cl.
*H01L 51/52* (2006.01)
*H01L 51/56* (2006.01)
(52) U.S. Cl. ................................. 257/40; 257/E51.018
(58) Field of Classification Search .................... 257/40, 257/E51.018; 438/26
See application file for complete search history.

(56) References Cited

U.S. PATENT DOCUMENTS

| | | | |
|---|---|---|---|
| 6,281,634 B1 | 8/2001 | Yokoyama | |
| 6,420,834 B2 * | 7/2002 | Yamazaki et al. | ......... 315/169.3 |
| 6,429,599 B1 | 8/2002 | Yokoyama | |
| 6,433,486 B1 | 8/2002 | Yokoyama | |
| 2002/0057051 A1 | 5/2002 | Kobayashi | |
| 2002/0067123 A1 | 6/2002 | Seki et al. | |
| 2004/0201048 A1 | 10/2004 | Seki et al. | |
| 2005/0118328 A1 | 6/2005 | Seki et al. | |

(Continued)

FOREIGN PATENT DOCUMENTS

| | | |
|---|---|---|
| JP | 09-203803 A | 8/1997 |
| JP | 2000-323276 A | 11/2000 |

(Continued)

OTHER PUBLICATIONS

Official Communication issued in International Patent Application No. PCT/JP2008/063904, mailed on Nov. 18, 2008.

(Continued)

*Primary Examiner* — Calvin Lee
*Assistant Examiner* — Monica D Harrison
(74) *Attorney, Agent, or Firm* — Keating & Bennett, LLP

(57) ABSTRACT

The present invention provides an organic electroluminescent display device including an electroluminescent element with a reduced leakage current and also provides a production method thereof. The present invention is an organic electroluminescent display device including an electroluminescent element, the electroluminescent element comprising a lower electrode, an organic layer, a light-emitting layer, and an upper electrode, stacked one above the other on and above a substrate in this order, wherein the organic electroluminescent display device further includes a bank formed on the organic layer.

10 Claims, 7 Drawing Sheets

U.S. PATENT DOCUMENTS

| | | |
|---|---|---|
| 2005/0170076 A1 | 8/2005 | Seki et al. |
| 2005/0170550 A1 | 8/2005 | Seki et al. |
| 2005/0186403 A1 | 8/2005 | Seki et al. |
| 2005/0253131 A1 | 11/2005 | Kobayashi |
| 2006/0097623 A1* | 5/2006 | Abe et al. ............. 313/498 |
| 2007/0247066 A1* | 10/2007 | Tokairin et al. ......... 313/506 |
| 2009/0020751 A1 | 1/2009 | Seki et al. |
| 2010/0193817 A1* | 8/2010 | Amamiya et al. ......... 257/98 |

FOREIGN PATENT DOCUMENTS

| | | |
|---|---|---|
| JP | 2001-307878 A | 11/2001 |
| JP | 2002-124381 A | 4/2002 |
| JP | 2004-006362 | 1/2004 |
| JP | 2004-055159 A | 2/2004 |
| JP | 2007-242272 A | 9/2007 |
| WO | 99/48339 A1 | 9/1999 |
| WO | 01/74121 A1 | 10/2001 |

OTHER PUBLICATIONS

Official Communication issued in corresponding Chinese Patent Application No. 200880100525.5, mailed on Jan. 31, 2011.

* cited by examiner (a)

(b)

(a)

(b)

(a)

X3  Y3  76 76a  72  78

(b)

77
76
74
73
72
71
70
78

ORGANIC ELECTROLUMINESCENT DISPLAY DEVICE AND PRODUCTION METHOD THEREOF

TECHNICAL FIELD

The present invention relates to an organic electroluminescent display device and a production method thereof. More particularly, the present invention relates to an organic electroluminescent display device that can be produced preferably by an ink-jet process and also relates to a production method thereof.

BACKGROUND ART

Needs for flat panel displays are now growing in the advance information society. The flat panel displays such as a non-self-emitting LCD (liquid crystal display), a self-emitting PDP (plasma display panel), an inorganic EL (electroluminescent) display, and an organic EL display, are known. Particularly, the organic EL display is making remarkable progress.

The organic EL element, which is attracted attention as a next-generation light-emitting element, includes at least an organic light-emitting layer between a pair of electrodes, and if necessarily, further includes a charge injecting layer that injects charges into the light-emitting layer and a charge transporting layer that transports charges from the electrodes to an organic layer. This organic EL element can be reduced in its thickness and weight and has characteristics such as low-voltage driving, high luminance, and self-light emission. Such an organic EL element is now actively being researched and developed.

As a method of forming the organic EL element, deposition of organic materials or application thereof by an ink-jet process and the like, may be mentioned. For example, Patent Document 1 discloses a method in which an anode electrode and a light-emitting layer are formed in each pixel, and a hole transporting layer, an electron transporting layer, and a cathode electrode are formed in continuity in a plurality of pixels, as the method of forming films constituting an EL element by deposition. In this case, the light-emitting layers in respective pixels are separated from one another not by a bank but by being formed with a mask and a vacuum-deposition apparatus, and the like. So it is difficult for such a method to be applied to a large-sized organic EL display device. Further, such a method has room for improvement in productivity and cost effectiveness.

For example, Patent Document 2 discloses a method of applying materials constituting an organic EL element by an ink-jet process. According to such a method, a multi-layer of a hole injecting layer and a light-emitting layer, which constitutes an organic EL element, is applied in a region between banks. The hole injecting layer, which has conductivity, is exposed if it is applied in a larger region than that of the light-emitting layer arranged thereabove. In such a case, a leakage current having no contribution to light emission might be generated if a cathode electrode is formed on the light-emitting layer.

For example, Patent Document 3 discloses a method of suppressing such a leakage current in an organic EL element including a multi-layer structure of a hole injecting/transporting layer and a light-emitting layer, these layers being formed so that the area for deposition of the light-emitting layer is equal to or greater than the area for deposition of the hole injecting/transporting layer.

In addition, for example, Patent Document 4 discloses a method of providing a bank surface with non-affinity greater than that of a film surface in a region between banks, thereby stacking flat films in the region between the banks, as a method of forming layers constituting an organic EL element so that the thickness of the respective layers is uniform. Further, for example, Patent Document 5 discloses a method of hindering an organic EL material from migrating from one space between banks to another by providing a bank top surface with a lyophobic treatment.

In addition, for example, Patent Document 6 discloses that a substrate surface on which a light-emitting layer is to be formed is provided with a lyophobic treatment, as a way of forming a light-emitting layer without forming a bank in an EL element-forming method involving application of liquid materials.

With respect to a manufacture of a color filter by an ink-jet process, for example, Patent Document 7 discloses that a projection for partitioning pixels has an ink-repellent top surface. According to this method, it can be possible to prevent an ink that has been injected into one pixel region from spreading into another or bleeding.

[Patent Document 1]
Japanese Kokai Publication No. 2004-6362
[Patent Document 2]
Japanese Kokai Publication No. 2000-323276
[Patent Document 3]
WO 01/074121
[Patent Document 4]
WO 99/48339
[Patent Document 5]
Japanese Kokai Publication No. 2004-55159
[Patent Document 6]
Japanese Kokai Publication No. 2002-124381
[Patent Document 7]
Japanese Kokai Publication No. Hei-09-203803

DISCLOSURE OF INVENTION

Even in such a method as in Patent Document 3 where a light-emitting layer completely covers a charge injecting/transporting layer between banks, the light-emitting layer may be formed to have a non-uniform thickness. In this case, an electric field is locally concentrated, possibly resulting in an increase in leakage current.

According to such a method as in Patent Document 4, it is difficult for the pixels on the entire substrate to be uniformly provided with a plasma treatment, possibly resulting in non-uniform thickness of a film formed on the plasma-treated surface. Further, a charge injecting/transporting layer that is formed between banks might spread on the surrounding banks, which makes it difficult for a light-emitting layer and the like to completely cover the charge injecting/transporting layer from above.

According to such a method as in Patent Document 5, a lyophobic treatment might damage a hole transporting material. Further, it is difficult to control the thickness of a hole transporting layer when a material for the layer is applied between banks. An electric field is locally concentrated if the hole transporting layer is formed to have a non-uniform thickness, which results in an increase in leakage current having no contribution to light emission. According to such a method as in Patent Document 6, a lyophilic treatment might damage an organic film on a substrate, and as a result, light emission characteristics might be deteriorated.

The present invention has been made in view of the above-mentioned state of the art. The present invention has an object to provide an organic EL display device including an EL element with a reduced leakage current, and also provides a production method thereof.

The present inventors made various investigations on an organic EL display device with a reduced leakage current. The inventors noted arrangement of an organic layer such as a charge injecting/transporting layer, a light-emitting layer, and a bank. The inventors found the followings. In a configuration where an organic layer that is positioned in a layer lower than a light-emitting layer is partitioned by a bank, a material for the organic layer adheres to a side surface of the bank, and in such a case, the light-emitting layer, which is also partitioned by the bank, can not completely cover the organic layer. This causes an increase in leakage current. Then, the inventors found that if the organic EL display device includes a bank on and above the organic layer, which is arranged in a lower layer than the light-emitting layer, a material for the organic layer can be prevented from adhering to a side surface of the bank, and as a result, a leakage current having no contribution to light emission can be suppressed. The inventors also found that in such a method, the organic layer can be formed in use of a coating apparatus for spin coating, and the like, and so this method can be easily applied to a large-sized organic EL display device, and further productivity and cost effectiveness can be improved. As a result, the above-mentioned problems have been admirably solved, leading to completion of the present invention.

The present invention is an organic electroluminescent display device including an electroluminescent element, the electroluminescent element comprising a lower electrode, an organic layer, a light-emitting layer, and an upper electrode, stacked one above the other on and above a substrate in this order, wherein the organic electroluminescent display device further includes a bank formed on the organic layer.

The present invention is mentioned below in detail.

The organic electroluminescent display device (hereinafter, also referred to as an "organic EL display device") of the present invention includes an electroluminescent element (organic EL element) including a lower electrode, an organic layer, a light-emitting layer, and an upper electrode, stacked one above the other in this order on a substrate. The above-mentioned EL element is not especially limited and may include other layers as long as at least the organic layer and the light-emitting layer are arranged from the substrate side in this order between the lower and upper electrodes. The above-mentioned substrate is not especially limited, but preferably a transparent substrate with insulating property. Examples thereof include a glass substrate, a quarts substrate, and a plastic substrate.

It is preferable that the lower and upper electrodes function as an anode electrode and a cathode electrode, respectively, of the EL element. Specifically, it is preferable that one of the upper and lower electrodes functions as an anode electrode of the EL element and the other functions as a cathode electrode thereof. Alkali metals, alkali earth metals, and the like, are mentioned as a material for the cathode electrode. From viewpoint of stability, the cathode electrode is preferably a calcium film, an aluminum film, a calcium-aluminum multilayer film, a magnesium alloy film, a barium film, a barium compound film, a cesium film, a cesium compound film, a fluorine compound film, or the like. Indium tin oxide (ITO), indium zinc oxide (IZO (registered trademark)) and the like, may be mentioned as the anode electrode. If light generated from the light-emitting layer is emitted through the lower electrode, it is preferable that the lower electrode is made of a transparent electrically conductive material. ITO, IZO, and the like, are mentioned as such a material for the lower electrode. Similarly, it is also preferable that the upper electrode is made of a transparent electrically conductive material if light generated from the light-emitting layer is emitted through the upper electrode. ITO, IZO, and the like, are mentioned as such a material for the upper electrode.

One of electron and hole that is injected from the upper electrode and the other from the lower electrode are recombined with each other, and thereby the light-emitting layer emits light. The light-emitting layer preferably contains an organic light-emitting material, and more preferably it is composed of an organic light-emitting material.

The above-mentioned organic layer is not especially limited as long as it can transport charges contributing to light emission from the lower electrode to the light-emitting layer. The organic layer is preferably a charge injecting/transporting layer that has a function of stably transporting charges injected from the lower electrode to the light-emitting layer, a layer that blocks carriers migrating from the upper electrode, or a layer that suppresses exciton from disappearing in the anode electrode, for example. Further, a buffer layer that is arranged between the electrode and the charge injecting/transporting layer, a charge injecting layer, a charge transporting layer, and the like, are also mentioned as the organic layer. The organic layer preferably contains an organic non-light-emitting material, and more preferably, it is composed of an organic non-light-emitting material.

The above-mentioned organic EL display device includes a bank formed on and above the organic layer. The bank may be formed directly on and above the organic layer or formed directly on and above another layer arranged between the bank and the organic layer as long as the bank is arranged in a layer upper than the organic layer. In this case, the upper surface (the surface on the side opposite to the substrate side) of the organic layer is positioned on the substrate side of the bottom surface (the surface on the substrate side) of the bank. Attributed to the configuration where the bank is formed on and above the organic layer, a material for the organic layer can be prevented from adhering to a side surface of the bank. Further, in such a configuration, the flatness of the organic layer surface is improved, which can suppress a variation in thickness of the light-emitting layer and the like formed on and above the organic layer. Thus, this can suppress a current from being locally concentrated in a film formed in a layer upper than the organic layer, and as a result, a leakage current having no contribution to light emission can be suppressed. In addition, attributed to the suppression of the leakage current, light-emitting efficiency and life-time of the EL element can be improved. The above-mentioned organic layer is not necessarily patterned, and it can be easily formed by spin coating and the like, for example. This can simplify the production steps. In the present specification, the side where the light-emitting layer is positioned with respect to the organic layer is an upper side, and the side where the substrate is positioned with respect to it is a lower side. That is, the term "upper" or "above" means a direction away from the substrate, and the term "lower" or "below" means a direction closer to the substrate. Further, with regard to the phrase "directly on and above", for example, if a member is arranged directly on and above the organic layer, this member is arranged in a layer upper than the organic layer to overlap with at least a part of the organic layer and to be in contact with at least a part of the organic layer.

It is preferable that the bank partitions a layer (e.g., the light-emitting layer) formed on and above the organic layer. Specifically, it is preferable that the layer arranged on and above the organic layer is surrounded on at least two sides (different in azimuth by 180°) by the bank. The layer in each of the partitioned regions is in contact with a side surface of the bank. The layer can be partitioned under control, and uniformity of the thickness of the layer in each partitioned region can be improved. According to such a configuration, the bank can dam liquid materials for the partitioned layer and prevent mixing of the liquid materials. So the liquid materials can be applied by an ink-jet process, and the like, without any problems. It is preferable that the bank is arranged so that each of the partitioned regions is surrounded on all sides by the bank. The shape of the bank is not especially limited, and a shape that allows an increase in aperture ratio is preferable. For example, the bank may be formed to have a side surface vertical to the substrate plane or a side surface with a forward-tapered or inverse tapered shape.

With respect to a layer (hereinafter, also referred to a "first layer") that is arranged directly on and below the bank and a layer (hereinafter, also referred to a "second layer") that is arranged directly on and above the first layer, it is preferable that the first layer surface on the side opposite to the substrate side in a region where the bank is not arranged of the first layer is covered with the second layer. According to this, the second layer isolates the first layer from a layer arranged in a layer upper than the second layer, and so a leakage current having no contribution to light emission can be suppressed. Thus, it is preferable that the first layer surface on the side opposite to the substrate side is covered with the bank and the second layer. It is preferable that the first layer is not in contact with the side surface of the bank. This can suppress a variation in thickness of the layer partitioned by the bank, and thus, a leakage current having no contribution to light emission can be suppressed.

If pixels have colors and if the colors are different among the partitioned regions, the pixels may be arranged in any pattern, for example, a stripe, mosaic, delta, square pattern. Examples of the colors include three colors of red, green, and blue, or of cyan, magenta, and yellow, but not limited thereto. Four colors may be used. The ratio of a pixel area among red, green, and blue is not necessarily 1:1:1. The areas are the same or different among the three colors.

According to the above-mentioned organic EL display device, the lower electrode and the organic layer may be arranged with a layer therebetween, and the light-emitting layer and the organic layer may be arranged with a layer therebetween. Further, the light-emitting layer and the upper electrode are arranged with a layer therebetween. From viewpoint of reducing a leakage current having no contribution to light emission, it is preferable that the bank is arranged directly on and above the organic layer, the light-emitting layer is directly on and above the organic layer, and the upper electrode is arranged directly on and above the light-emitting layer. According to this, only the light-emitting layer is partitioned by the bank. This can prevent liquid materials for layers other than the light-emitting layer from adhering to or spreading on the side surface of the bank.

The configuration of the organic EL display device of the present invention is not especially limited. The organic EL element may or may not include other components as long as it essentially includes the above-mentioned components. The organic EL display device may be an active or passive matrix one, and such an active matrix one may include switching elements such as a TFT.

Preferable embodiments of the organic EL display device of the present invention are mentioned below in detail. Various embodiments mentioned below may be appropriately combined.

It is preferable that the organic layer is a charge injecting/transporting layer. The charge injecting/transporting layer does not emit light itself and has a function of transporting charges injected from the lower electrode to the light-emitting layer. According to this, the bank is formed on and above the charge injecting/transporting layer, and a leakage current having no contribution to light emission can be more suppressed, compared with the case where the charge injecting/transporting layer is partitioned by the bank. The charge injecting/transporting layer allows charges injected from the lower electrode to be more stably transported into the light-emitting layer. However, the charge injecting/transporting layer is made of an electrically conductive material, and so if it has an uneven thickness, an electric current is locally concentrated in a part of the light-emitting layer partitioned by the bank when an electric field is applied between the upper and lower electrodes. As a result, a leakage current having no contribution to light emission might be more increased. The liquid material for the charge injecting/transporting layer might spread on a side surface of the bank, and thus, the charge injecting/transporting layer might be formed to have a non-uniform thickness. The bank is arranged in a layer upper than the charge injecting/transporting layer, which can suppress a variation in thickness of the charge injecting/transporting layer. As a result, a leakage current having no contributions to light emission can be suppressed. The charges which the charge injecting/transporting layer transports to the light-emitting layer may be electrons or holes.

An electron injecting/transporting layer, a hole injecting/transporting layer, and the like, may be mentioned, but a hole injecting/transporting layer is preferable as the above-mentioned charge injecting/transporting layer. The hole injecting/transporting layer is more preferably made of a commonly used PEDOT-PSS, a mixture of PEDOT (polyethylenedioxythiophene) shown by the following formula (1) and PSS (polystylenesulfonic acid) shown by the formula (2). When the bank is formed and then PEDOT-PSS is applied to form the hole injecting/transporting layer, the PEDOT-PSS tends to spread on a side surface of the bank if the side surface has insufficient lyophobicity. As a result, the light-emitting layer, which is arranged in a layer upper than the hole injecting/transporting layer, might have a non-uniform thickness.

[Formula 1]

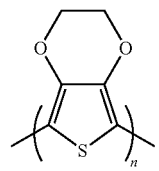

(1)

[Formula 2]

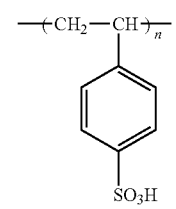

(2)

The charge injecting/transporting layer is arranged between the light-emitting layer and the lower electrode. If the charge injecting/transporting layer is a hole injecting/ transporting layer, it is preferable for easy hole-injection from the anode electrode to the light-emitting layer that a difference between a work function of the anode electrode and a HOMO (highest occupied molecular orbital) energy level of the charge injecting/transporting layer is as small as possible. If ITO (work function W of 5.0 eV) is used as the anode electrode, it is preferable that PEDOT-PSS that can provide a HOMO (highest occupied molecular orbital) energy level of 5.1 eV when being in contact with the anode electrode is used as a material for the hole injecting-transporting layer. From viewpoint of transporting the hole into the light-emitting layer with efficiency, it is preferable that a difference between the HOMO energy level of the hole injecting/transporting layer in contact with the anode electrode and the HOMO energy level of the light-emitting layer is as small as possible. If the charge injecting/transporting layer is an electron injecting/transporting layer, it is preferable that a difference in LUMO (lowest unoccupied molecular orbital) energy level between the electron charging/transporting layer in contact with the cathode electrode and the light-emitting layer is as small as possible from viewpoint of efficient transportation of the electron into the light-emitting layer. Further, it is preferable that a difference between the LUMO energy level of the electron injecting/transporting layer and a vacuum level of the cathode electrode is as small as possible.

If the organic layer is a charge injecting/transporting layer, the EL element is not especially limited as long as at least the lower electrode, the charge injecting/transporting layer, the light-emitting layer, and the upper electrode are stacked one above the other in this order. For example, the charge injecting/transporting layer and the light-emitting layer may or may not be arranged with another layer therebetween.

It is preferable that the bank is formed directly on and above the charge injecting/transporting layer, and the light-emitting layer is partitioned by the bank and arranged directly on and above the charge injecting/transporting layer. According to this, the charge injecting/transporting layer and the light-emitting layer are arranged without any other layers therebetween, and so the uniformity of the thickness of the light-emitting layer partitioned by the bank can be more improved. As a result, a leakage current having no contribution to light emission can be suppressed.

It is preferable that the organic electroluminescent display device further includes an intermediate layer for blocking carrier transferred from the upper electrode between the charge injecting/transporting layer and the light-emitting layer, and the bank is arranged on and above the intermediate layer. The above-mentioned intermediate layer does not emit light itself, and it has a function (1) of blocking carriers (electrons or holes) migrating from the upper electrode, specifically, preventing the carriers migrating from the upper electrode through the light-emitting layer from migrating through the intermediate layer to the lower electrode side. It is more preferable that in addition to the function (1), the intermediate layer has at least one of a function (2) of reducing exciton loss by keeping the exciton within the light-emitting layer and a function (3) of accelerating injection of charges from the lower electrode to the light-emitting layer. Attributed to the function (1), electrons can be suppressed from migrating from the light-emitting layer to the anode electrode, which can improve light-emitting efficiency. Further, deterioration of the hole injecting/transporting layer, which is caused by flow of electrons from the light-emitting layer into the hole injecting/transporting layer, can be suppressed. The above-mentioned carriers and the charges transported from the lower electrode through the charge injecting/transporting layer to the light-emitting layer are a pair of negative and positive charge carriers. If such a charge is hole, the above-mentioned carrier is electron, and if it is electron, the above-mentioned carrier is hole. Attributed to the function (2), exciton loss near the interface between the light-emitting layer and the organic layer in contact therewith such as the charge injecting/transporting layer can be suppressed, which can more improve light-emitting efficiency. Attributed to the function (3), charges injected from the charge injecting/transporting layer can be more efficiently transported to the light-emitting layer, which can improve the light-emitting efficiency.

It is more preferable that the organic electroluminescent display device further includes an intermediate layer for blocking carrier transferred from the upper electrode between the charge injecting/transporting layer and the light-emitting layer, and the bank is arranged on and above the intermediate layer. This can suppress a liquid material for the intermediate layer from adhering to a side surface of the bank, and as a result, the intermediate layer can be formed to have a uniform thickness. As a result, a leakage current having no contribution to light emission can be more suppressed. Further, the intermediate layer can be arranged over the entire display region, and so the liquid material for the intermediate layer can be suppressed from spreading on the side surface of the bank compared with the case where the intermediate layer is partitioned by the bank as in the light-emitting layer. As a result, a leakage current and a variation in thickness can be suppressed. The above-mentioned display region means a region including a region where the light-emitting layer is arranged and a region where the bank is arranged.

It is preferable that the organic layer is an intermediate layer for blocking carrier transferred from the upper electrode. This can suppress migration of electrons to the anode electrode from the light-emitting layer, which can improve light-emitting efficiency. If a hole injecting/transporting layer is arranged between the intermediate layer and the lower electrode and if electrons flow from the light-emitting layer into the hole injecting/transporting layer, the hole injecting/transporting layer might be deteriorated. However, according to the above-mentioned configuration, deterioration of the hole injecting/transporting layer can be suppressed.

It is preferable that a layer that is arranged directly on and below the bank has a width larger than that of a region surrounded by the bank. That is, it is preferable that at least a portion of the layer that is arranged directly on and below the bank is in contact with a lower portion of the bank. According to this, the layer that is arranged directly on and below the bank is formed in continuity over a region surrounded by the bank and a region where the bank is arranged. As a result, the layer that is arranged directly on and below the bank can be prevented from spreading on the side surface of the bank. It is preferable that the layer arranged directly on and below the bank is arranged in the entire display region. According to this, a patterning step can be omitted, and as a result, the production steps can be simplified and the film thickness can be uniformed. The layer that is arranged directly on and below the bank is not especially limited, and it may be the above-mentioned organic layer or another layer. The region surrounded by the bank includes not only a region of the layer where the bank is formed but also regions of layers upper or lower than the layer where the bank is formed. Thus, it is preferable that an end portion of the member (the organic layer or the like) arranged directly on and below the bank and in the region surrounded by the bank is positioned under the bank and does not spread on the side surface of the bank.

If the bank has a contact angle of smaller than 90° with respect to water, a liquid material for the light-emitting layer and the like might remain on the upper surface of the bank. Further, a region surrounded by the bank might not be sufficiently filled with the liquid material, and as a result, color mixing between adjacent two pixels might occur. In addition, the liquid material needs to be applied many times to form a film with a desired thickness, which possibly increases the tact time. Thus, it is preferable that the bank is made of a material having a contact angle of 90° or larger with respect to water. If the bank has a contact angle of larger than 120° with respect to water, the liquid material does not spread to the vicinity of the bank due to the lyophobicity of the bank, which makes it impossible to completely cover the organic layer that is arranged in a layer lower than the bank with the liquid material. As a result, the leakage current might be increased. Accordingly, it is preferable that the bank is made of a material having a contact angle of 120° or smaller with respect to water. Thus, it is more preferable that the bank is made of a material having a contact angle of 90 to 120° with respect to water in view of improving thickness uniformity of the light-emitting layer. It is preferable that the bank is made of a material containing at least one of a fluorine-containing material and a silicon-containing material. Examples of the material for the bank include fluorine-containing resins, fluorine compound-added materials, silicon-containing materials, materials containing a fluorine atom and a silicon atom. According to this, the liquid materials for the organic EL layers (the layers constituting the EL element except for the upper and lower electrodes) tend to be repelled by the fluorine- or silicon-containing materials. Thus, the lyophobicity of the bank can suppress such materials from adhering to the side surface of the bank.

It is preferable that the bank is made of a material having a contact angle of 30° or larger and 70° or smaller with respect to anisole. This can improve thickness uniformity of the light-emitting layer. If it is smaller than 30°, the liquid material for the light-emitting layer and the like might remain on the upper surface of the bank. If it is larger than 70°, the liquid material for the light-emitting layer and the like might not spread to the vicinity of the bank because of the lyophobicity of the bank.

The present invention is also a production method of the organic electroluminescent display device,
including the steps of:
forming the bank on and above the organic layer; and
forming the light-emitting layer with a coating apparatus.
The step of forming the bank on and above the organic layer is performed after formation of the organic layer. This can prevent the liquid material for the organic layer from spreading on the bank, and so if the light-emitting layer is partitioned by the bank, a variation in thickness of the light-emitting layer can be prevented. So a leakage current having no contribution to light emission can be suppressed. A thermal transfer, printing, photolithography, and the like, may be used for forming the bank.

The present invention is further a production method of the organic electroluminescent display device,
including a step of forming the bank by applying a photosensitive resin on and above the organic layer, pattern-exposing the photosensitive resin, and removing an uncured portion of the photosensitive resin with an organic solvent. The most serious problem when a bank is formed into a fine pattern on a functional organic thin film (organic layer) such as the charge injection/transfer layer and the intermediate layer is that the bank should be formed without deterioration of functions of the functional organic thin film. According to photolithography, which is now most widely used, pattern formation needs development with an alkali aqueous solution. The alkali alters the functional organic thin film, resulting in insufficient light-emitting characteristics. Further, printing or thermal transfer, which brings no damages on the functional organic thin film, still have room for improvement in that a film can not be patterned into a sufficiently-fine pattern. In contrast, according to the above-mentioned production method, the pixel can be accurately formed into a fine pattern because the photolithography, which has been much used in fine pattern formation, is used for pattern exposing. In addition, the functional organic thin film (organic layer) can not be damaged attributed to use of an organic solvent for development. Thus, the organic EL display device including finely patterned EL element with excellent light-emitting characteristics can be produced by high yield processes. The above-mentioned production method may further include a step of forming the light-emitting layer with a coating apparatus.

It is preferable that the organic layer is formed by application of a liquid material containing a solvent and an organic material dissolved therein. If a liquid crystal material is applied to fill a region partitioned by the bank to form the organic layer, the liquid material might spread on the bank or adhere to the side surface of the bank. The production method of the present invention can be particularly preferably used when the organic layer is made of a liquid material. The organic material for the organic layer such as the charge injecting/transporting layer and the intermediate layer may be a polymer material or a low-molecular material as long as a liquid material in which the organic material is dissolved can be applied with a coating apparatus. Spin coating, ink jet, printing, spray coating, nozzle coating, and the like, may be mentioned as a method of applying the material for the organic layer.

It is preferable that a substrate surface on which the organic layer is to be arranged is provided with a lyophilic treatment before formation of the organic layer. Attributed to the lyophilic treatment, the thickness uniformity of the organic layer can be more improved. If an organic layer is partitioned by the bank, for example, the bank might hinder uniform lyophilic treatment for the region where the organic layer is to be arranged. If the bank has lyophilicity, the liquid material that is applied to fill a region partitioned by the bank might adhere to a side surface of the bank. So according to such a method as in Patent Document 6, the bank is not provided with the lyophilic treatment, if necessary, by using a mask for defining a region to be provided with the lyophilic treatment. In contrast, the lyophilic treatment for the substrate on which the organic layer is to be formed in accordance with the present invention does not need the definition with the mask and the like because the lyophilic treatment is performed before formation of the bank. This can simplify the production steps.

It is preferable that the coating apparatus is an ink-jet apparatus. Use of the ink-jet apparatus allows the light-emitting layer to be easily formed without patterning steps and the like. Such a method can easily apply to production a large-sized display device. In addition, use efficiency of a material for the light-emitting layer and the like is high and production costs can be reduced.

The material for the above-mentioned photosensitive resin is not especially limited, but it is preferably a UV curable resin. The UV curable resin is easily available, which makes it easier to produce the organic EL display device of the present invention.

It is preferable that the organic solvent includes at least one selected from the group consisting of ketone solvents, ester solvents, nitrogen-containing organic solvents, sulfur-containing organic solvents, aromatic solvents, ether solvents, halogenated hydrocarbon solvents, and alcohol solvents. These organic solvents are easily available, which makes it easier to produce the organic EL display device of the present invention.

EFFECT OF THE INVENTION

According to the organic EL display device of the present invention, the bank is formed on and above the organic layer, which can suppress a material for the organic layer from adhering to a side surface of the bank. As a result, a leakage current can be reduced.

BEST MODES FOR CARRYING OUT THE INVENTION

The present invention is mentioned in more detail below with reference to Embodiments using drawings, but not limited only thereto. According to the following Embodiments, bottom-emission organic EL display devices that provide only blue emission are prepared. It should be understood that the present invention can be applied to a full-color organic EL display device and also applied to a top-emission organic EL display device.

Embodiment 1

FIG. 1(a) is a schematic plan view of an organic EL display device in accordance with Embodiment 1. FIG. 1(b) is a cross-sectional view taken along line X1-Y1 of FIG. 1(a).

According to the organic EL display device of Embodiment 1, a lower electrode 12 made of ITO (indium tin oxide) is formed into a stripe pattern on a glass substrate 11 to have a thickness of 150 nm. The lower electrode 12 functions as an anode electrode of an organic EL element 10. Thereon, a charge injecting/transporting layer 13 made of PEDOT-PSS is arranged to have a thickness of 80 nm in a region 18 surrounded by the bank (on the lower electrode 12). The charge injecting/transporting layer 13 functions as a hole injecting/transporting layer that transports and injects holes into the light-emitting layer 14. On the charge injecting/transporting layer 13, a bank 16 for partitioning the light-emitting layer 14 is arranged in a stripe pattern and in parallel to the lower electrodes 12. Thus, the bank 16 is formed in a space between adjacent ones of the lower electrodes 12 and along thereto. The light-emitting layer 14 is arranged to be surrounded on two sides by the bank 16. The bank 16 is made of a fluorine-containing resin. The light-emitting layer 14 is a blue light-emitting layer made of a polyfluorene compound. On the light-emitting layer 14 and the bank 16, an upper electrode 17, which is a calcium-aluminum multilayer film, is arranged on the entire substrate 11 in a region where the bank is arranged and in the region 18 surrounded by the bank. Thus, the EL element 10 is formed. The upper electrode 17 is formed to cover the light-emitting layer 14 and the bank 16.

A production method of the organic EL display device in accordance with Embodiment 1 is mentioned below.

An ITO (indium tin oxide) film was formed on the glass substrate 11 to have a thickness of 150 nm. This ITO film was patterned into a stripe pattern by photolithography to form the lower electrode 12. A glass substrate was used as the substrate 11, but not limited thereto. A quartz or plastic substrate, and the like, may be used.

The glass substrate 11 on which the lower electrode 12 had been formed, was rinsed by wet process with isopropyl alcohol, acetone, purified water, and the like, and then provided with a lyophilic treatment by oxygen plasma treatment.

According to the oxygen plasma treatment, oxygen atoms are bonded or adhere to the glass substrate surface, and as a result, hydrogen bonding easily occurs and the glass substrate surface can be rinsed. Such a lyophilic treatment could be uniformly provided for the entire glass substrate 11 surface on which the lower electrode 12 had been formed.

Then, a mixture aqueous solution of PEDOT and PSS was spin-coated on the glass substrate 11 on which the lower electrode 12 had been formed, and then, the substrate was dried by heating at 200° C. for 30 minutes. By this drying by heat treatment, the solvent into which PEDOT and PSS had been dispersed was removed, and as a result, the charge injecting/transporting layer 13 was formed. Then, by thermal transfer, the bank 16 was formed on the charge injecting/transporting layer 13 into a stripe pattern and in a parallel to the lower electrode 12. Thus, the region 18 surrounded by the bank 16 was formed. The bank 16 was made of a fluorine-containing resin and had a contact angle of 90° with respect to water. The material for the bank may be a fluorine compound-added material, a silicon-containing material, or the like.

Then, a liquid material containing a non-polar solvent such as xylene and a polyfluorene compound shown by the following formula (3) dissolved therein was pattern-applied in the region 18 surrounded by the bank 16 with an ink-jet apparatus. After the pattern application, the solvent was removed. Thus, the blue light-emitting layer 14 was formed. Thereon, the upper electrode 17, which was a calcium-aluminum multilayer, was formed, and then a glass cap was arranged for sealing. As a result, the EL element 10 was completed.

[Formula 3]

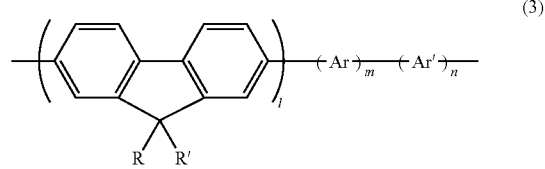

(3)

The polyfluorene compound represented by the formula (3) is a copolymer of a fluorene ring having alkyl chains R and R' and one or more units of an aryl compound. R and R' in the compound (I) represents an alkyl chain; Ar and Ar' represents a unit of an aryl compound; l and m being an integer of 1 or more; n being 0 or an integer of 1 or more. Examples of the aryl compound include methylbenzene, pyridine, benzene, anthracene, spirobifluorene, carbazole, benzoamine, bipyridine, and benzothiadiazole. Colors emitted depend on the unit to be copolymerized and a ratio among l, m, and n.

Embodiment 2

FIG. 2 is a cross-sectional view schematically showing a configuration of an organic EL display device in accordance with Embodiment 2. The schematic plan view of the organic EL display device of Embodiment 2 is omitted because it has the same planar shape as in Embodiment 1, shown in FIG. 1(a).

The organic EL display device of Embodiment 2 has the same configuration as in Embodiment 1, except that an intermediate layer is arranged between the charge injecting/transporting layer, and the bank and the light-emitting layer. On a substrate 21, a lower electrode 22 of ITO is arranged in a stripe pattern. Thereon, a charge injecting/transporting layer 23 of PEDOT-PSS and an intermediate layer 25 of a triphenyl amine compound are arranged in this order in the entire substrate 21 region. On the intermediate layer 25, a bank 26 of a fluorine-containing compound is arranged in a stripe pattern to give a region 28 surrounded by the bank. Thus, the bank 26 is arranged in a space between adjacent ones of the lower electrodes 22 and along thereto. In the region surrounded by the bank 26, a blue light-emitting layer 24 of a polyfluorene compound is arranged. On the light-emitting layer 24 and the bank 26, an upper electrode 27, which is a calcium-aluminum multi-layer film, is arranged in the entire substrate region. Thus, an EL element 20 is completed. Thus, the upper electrode 27 covers the light-emitting layer 24 and the bank 26.

The intermediate layer 25 is formed by spin-coating a liquid material containing a nonpolar solvent such as xylene and a triphenyl amine compound dissolved therein and by drying it. The material for the intermediate layer 25 is not especially limited as long as it has a function of preventing charges transported through the light-emitting layer 24 from the upper electrode 27 from being injected into the charge injecting/transporting layer 23. If an upper electrode is a cathode electrode and a charge transported through the light-emitting layer from the upper electrode is an electron, as in the present Embodiment, examples of the material for the intermediate layer 25 include poly[(9,9-dioctylfluorenyl-2,7-diyl)-co-(1,4-ethylenylbenzene)], poly[(9,9-dihexylfluorenyl-2,7-diyl)-co-(9-ethyl-3,6-carbazole)], and poly[(9,9-dihexylfluorenyl-2,7-diyl)-co-(2,5-p-xylene)]. These compounds are dissolved in a nonpolar solvent to be applied. It is preferable that the thickness of the intermediate layer 25 is not larger than half of the thickness of the light-emitting layer 24 from viewpoint of driving voltage. Use of the intermediate layer 25 allows a reduction in driving voltage of the EL element and an improvement in light-emitting efficiency. Further, the lifetime of the EL element can be improved, for example.

Embodiment 3

FIG. 3 is a cross-sectional view schematically showing a configuration of an organic EL display device in accordance with Embodiment 3. The schematic plan view of the organic EL display device of Embodiment 3 is omitted because it has the same planar shape as in Embodiment 1, shown in FIG. 1(a).

The organic EL display device of Embodiment 3 has the same configuration as in Embodiment 1, except that an intermediate layer is arranged in a region surrounded by the bank between the charge injecting/transporting layer and the light-emitting layer. On a substrate 31, a lower electrode 32 of ITO is arranged in a stripe pattern. Thereon, a charge injecting/transporting layer 33 of PEDOT-PSS is arranged in the entire substrate 31 region. On the charge injecting/transporting layer 33, a bank 36 of a fluorine-containing compound is arranged in a stripe pattern to give a pixel region 38. Thus, the bank 36 is arranged in a space between adjacent ones of the lower electrodes 32 and along thereto. In the region surrounded by the bank 36, an intermediate layer 35 with a thickness of 25 nm, made of a liquid material containing a nonpolar solvent such as xylene and a triphenyl amine compound dissolved therein, and a blue light-emitting layer 34 of a polyfluorene compound are arranged in this order. On the light-emitting layer 34 and the bank 36, an upper electrode 37, which is a calcium-aluminum multi-layer film, is arranged in the entire substrate region. Thus, an EL element 30 is completed. The upper electrode 37 covers the light-emitting layer 34 and the bank 36.

The intermediate layer 35 is formed by pattern-applying a liquid material containing a nonpolar solvent such as xylene and a triphenyl amine compound dissolved therein, in the region 38 surrounded by the bank 36 with an ink-jet apparatus. According to Embodiment 3, if a multi-color organic EL display device is produced, the intermediate layer can be provided with separate colors. So the thickness of the intermediate layer in each color can be optimally determined.

Configurations shown in FIGS. 4 and 5 are mentioned as the configuration where the intermediate layer is arranged in a region surrounded by the bank between the charge injecting/transporting layer and the light-emitting layer. According to the configuration shown in FIG. 4, an insulator 39a is arranged just below the bank 36 and positioned to be within the bank 36 region as viewed in plane, and a charge injecting/transporting layer 33a is arranged in the region 38 surrounded by the bank 36 to overlap with an end of the bank 36 as viewed in plane. Thus, an EL element 30a is formed. In the EL element 30a, the insulator 39a is arranged to be adjacent to the charge injecting/transporting layer 33a in the same plane thereof and arranged just below the bank 36 so as not to be out of the bank 36 region as viewed in plane. As shown in FIG. 5, an insulator 39b is arranged just below some of the banks 36 and positioned to be within each bank 36 region as viewed in plane, and a charge injecting/transporting layer 33b is arranged just below the bank 36 in an insulator 39b-free region and also arranged in the region 38 surrounded by the bank 36. Thus, an EL element 30b is completed. The insulator is arranged just below the bank, and thereby the layer arranged in a layer lower than the bank is partitioned. Thus, an effect of preventing cross-talk between the light-emitting regions can be exhibited. These devices in accordance with modified embodiments have the same plan view as in the organic EL display device of Embodiment 1. Examples of a way of forming these insulators 39a and 39b include a way of forming an inorganic insulating film (for example, a $SiO_2$ film) with a thickness of 100 nm on the lower electrode 32 formed on the substrate 31 with a sputtering apparatus and then patterning the inorganic insulating film. In this case, the charge injecting/transporting layers 33a and 33b may be applied between adjacent insulators 39a and 39b, respectively, with a nozzle coater, and the like, after the insulators 39a and 39b are formed.

Comparative Embodiment 1

FIG. 6 is a cross-sectional view schematically showing a configuration of an organic EL display device in accordance with Comparative Embodiment 1. The schematic plan view of the organic EL display device of Comparative Embodiment 1 is omitted because it has the same planar shape as in Embodiment 1, shown in FIG. 1(a).

The organic EL display device of Comparative Embodiment 1 has the same configuration as in Embodiment 1, except that the charge injecting/transporting layer is arranged not in a layer lower than the bank but in a layer lower than the light-emitting layer in a region surrounded by the bank. According to the organic EL display device of Comparative Embodiment 1, a lower electrode 112 is arranged on a substrate 111, and thereon, a bank 116 is formed. As a result, a region 118 surrounded by the bank is formed. On the lower electrode 112 arranged in the region 118 surrounded by the bank 116, a charge injecting/transporting layer 113 of PEDOT-PSS with a thickness of 70 nm and a light-emitting layer 114 of a polyfluorene compound with a thickness of 80 nm are arranged in this order. On the light-emitting layer 114, an upper electrode 117, which is a calcium-aluminum multilayer film, is formed in the entire display region. Thus, an EL element 110 is formed. According to Comparative Embodiment 1, a liquid material is applied by an ink-jet process to form the charge injecting/transporting layer 113.

Comparative Embodiment 2

FIG. 7 is a cross-sectional view schematically showing a configuration of an organic EL display device in accordance with Comparative Embodiment 2. The schematic plan view of the organic EL display device of Comparative Embodiment 2 is omitted because it has the same planar shape as in Embodiment 1, shown in FIG. 1(a).

The organic EL display device of Comparative Embodiment 2 has the same configuration as in Comparative Embodiment 1, except that an intermediate layer is arranged between the charge injecting/transporting layer and the light-emitting layer in a region surrounded by the bank. According to the organic EL display device of Comparative Embodiment 2, on a substrate 121, a lower electrode 122 is arranged, and thereon, a bank 126 is formed to give a region 128 surrounded by the bank. On the lower electrode 122 arranged in the region 128 surrounded by the bank 126, a charge injecting/transporting layer 123 of PEDOT-PSS with a thickness of 70 nm, an intermediate layer 125 of a triphenylamine compound with a thickness of 25 nm, and a light-emitting layer 124 of a polyfluorene compound with a thickness of 80 nm are arranged in this order. On the light-emitting layer 124, an upper electrode 127, which is a calcium-aluminum multi-layer film, is arranged in the entire display region. Thus, an EL element 120 is formed. According to Comparative Embodiment 2, liquid materials for the charge injecting/transporting layer and the intermediate layer are applied by an ink-jet process to give the charge injecting/transporting layer 123 and the intermediate layer 125.

Evaluation Tests for Defect Rate

The organic EL display devices of Embodiments 1 to 3 and Comparative Embodiments 1 and 2 were measured for leakage current value. Based on it, a defect rate was calculated. A hundred of devices, each of Embodiments and Comparative Embodiments, were subjected to the measurement. A device showing a current density of $5.0 \times 10^{-5}$ mA/cm$^2$ or higher by application of a voltage of 1V between the lower and upper electrodes of the organic EL element was evaluated as a defect. The following Table 1 shows evaluation results of the defect rate. The device having a configuration shown in FIG. 3 was used for measurement as a device of Embodiment 3.

TABLE 1

|  | Defect rate |
| --- | --- |
| Embodiment 1 | 5% |
| Embodiment 2 | 6% |
| Embodiment 3 | 18% |
| Comparative Embodiment 1 | 53% |
| Comparative Embodiment 2 | 74% |

As shown in the results of Table 1, the defect rates of the organic EL display devices of Embodiments 1 to 3 are 5%, 6%, and 18%, respectively, and the defect rates of the organic EL display devices of Comparative Embodiments 1 and 2 are 53% and 74%, respectively. This shows that the defect rate can be significantly reduced in the organic EL display devices of Embodiments 1 to 3. According to Embodiments 1 to 3, the charge injecting/transporting layer is arranged in a layer lower than the bank to suppress the liquid material for the charge injecting/transporting layer from spreading on a side surface of the bank, and further, the charge injecting/transporting layer is formed before the bank is formed to suppress a liquid material for the charge injecting/transporting layer from adhering to the side surface of the bank. This could suppress an electric field applied into the light-emitting layer from being locally concentrated in a part of the layer, which would result in a reduction in leakage current. The present invention can provide an organic EL display device that has a reduced leakage current when a low voltage is applied and is excellent in light-emitting efficiency and lifetime.

In Embodiment 2 where both of the charge injecting/transporting layer and the intermediate layer are arranged in a layer lower than the bank, the defect rate is 6%. In Embodiment 3 where the charge injecting/transporting layer is arranged in a layer lower than the bank and the intermediate layer is partitioned by the bank, the defect rate is 18%. This shows that also when the other organic layers such as the intermediate layer are arranged in a layer lower then the bank, the advantages of the present invention can be sufficiently exhibited.

Comparisons between Embodiments 2 and 3, and between Comparative Embodiments 1 and 2 show that the defect rate increases as the number of the pattern-application for the region between the banks is increased. Specifically, from viewpoint of reducing the leakage current, as shown in Embodiments 1 and 2, it is preferable that only an organic material for the light-emitting layer among the organic materials for the EL element is applied in a region partitioned by the bank. This can prevent a liquid material discharged from a head of an ink-jet apparatus from changing its trajectory to be splashed into a non-target region, in the layers other than the light-emitting layer. As a result, a leakage current can be more suppressed, which leads to a decrease in defect rate.

Embodiment 4

FIG. 8(a) is a schematic plan view of an organic EL display device in accordance with Embodiment 4. FIG. 8(b) is a cross-sectional view taken along line X2-Y2 of FIG. 8(a).

The organic EL display device of Embodiment 4 has the same configuration as in Embodiment 1, except for the patterns of the bank and the light-emitting layer. On a substrate 41, a lower electrode 42 of ITO is arranged into a stripe pattern. Thereon, a charge injecting/transporting layer 43 of PEDOT-PSS is arranged in the entire substrate 41 region. On the charge injecting/transporting layer 43, a bank 46 of a fluorine-containing compound is arranged to have an elliptical opening 46a as viewed in plane to give a region 48 surrounded by the bank. In the opening 46a surrounded on all four sides by the bank 46, a blue light-emitting layer 44 of a polyfluorene compound is arranged. Thus, the bank 46 partitioning the light-emitting layer 44 is pattern-formed so that the elliptical openings 46a are arrayed. The openings 46a are arranged in the extending direction of the lower electrode 42. The organic EL display device of Embodiment 4 includes depressions surrounded on all four sides by the bank 46 in a region corresponding to the opening 46a. On the light-emitting layer 44 and the bank 46, an upper electrode 47, which is a calcium-aluminum multi-layer film, is arranged in the entire substrate region. Thus, an EL element 40 is completed. The upper electrode 47 covers the light-emitting layer 44 and the bank 46.

Embodiment 5

An organic EL display device in accordance with Embodiment 5 has the same configuration as in Embodiment 4, except that an intermediate layer is arranged between the charge injecting/transporting layer, and the bank and the light-emitting layer, similarly to the configuration of Embodiment 2 shown in FIG. 2. The schematic plan view of the organic EL display device of Embodiment 5 is omitted because it has the same planar shape as in the organic EL display device of Embodiment 4, shown in FIG. 8(a).

Embodiment 6

An organic EL display device in accordance with Embodiment 6 has the same configuration as in Embodiment 4, except that an intermediate layer is arranged in a region surrounded by the bank between the charge injecting/transporting layer and the light-emitting layer, similarly to the configuration of Embodiment 3 shown in FIG. 3. The schematic plan view of the organic EL display device of Embodiment 6 is omitted because it has the same planar shape as in the organic EL display device of Embodiment 4, shown in FIG. 8(a).

The shape of the openings of the bank in Embodiments 4 to 6 is not especially limited and may be an elliptical shape shown in FIG. 8(a), a circular shape, and the like, as long as the openings are surrounded on all four sides by the bank. It is preferable that these openings have such a shape that the liquid material (ink) for the light-emitting layer or the intermediate layer can easily spread four corners of the opening and an area of the light-emitting portion can be as large as possible.

Comparative Embodiment 3

An organic EL display device in accordance with Comparative Embodiment 3 has the same configuration as in Embodiment 4, except that the charge injecting/transporting layer is arranged not in a layer lower than the bank but in a layer lower than the light-emitting layer in a region surrounded by the bank, similarly to the configuration of Comparative Embodiment 1 shown in FIG. 6. The schematic plan view of the organic EL display device of Comparative Embodiment 3 is omitted because it has the same planar shape as in the organic EL display device of Embodiment 4, shown in FIG. 8(a).

Comparative Embodiment 4

An organic EL display device in accordance with Comparative Embodiment 4 has the same configuration as in Comparative Embodiment 3, except that an intermediate layer is arranged between the charge injecting/transporting layer and the light-emitting layer in a region surrounded by the bank, similarly to the configuration of Embodiment 2 shown in FIG. 7. The schematic plan view of the organic EL display device of Comparative Embodiment 4 is omitted because it has the same planar shape as in the organic EL display device of Embodiment 4, shown in FIG. 8(a)

Evaluation Tests of Defect Rate

The organic EL display devices of Embodiments 4 to 6 and Comparative Embodiments 3 and 4 were evaluated for defect rate, as performed for those in Embodiments 1 to 3 and Comparative Embodiments 1 and 2. The defect rates of the organic EL display devices of Embodiments 4 to 6 are 9%, 11%, and 20%, respectively, and the defect rates of the organic EL display devices of Comparative Embodiments 1 and 2 are 60% and 86%, respectively. This shows that the defect rate can be significantly reduced in the organic EL display devices of Embodiments 4 to 6. A comparison between Embodiments 1 to 3 and Embodiments 4 to 6 shows that as a space surrounded by the bank is decreased, the defect rate is increased, which is partly because a trajectory of a liquid material (ink) for the light-emitting layer or the intermediate layer, discharged from a head of an ink-jet apparatus, is changed.

Embodiment 7

FIG. 9(a) is a schematic plan view of an organic EL display device in accordance with Embodiment 7. FIG. 9(b) is a cross-sectional view taken along line X3-Y3 of FIG. 9(a).

According to the organic EL display device of Embodiment 7, a lower electrode 72 of ITO (indium tin oxide) is arranged on a glass substrate 71 into a stripe pattern to have a thickness of 150 nm. The lower electrode 72 functions as an anode electrode of an organic EL element 70. Thereon, a charge injecting/transporting layer 73 of PEDOT-PSS is arranged to have a thickness of 80 nm in a region 78 surrounded by a bank (on the lower electrode 72). The charge injecting/transporting layer 73 functions as a hole injecting/transporting layer that transports and injects holes into the light-emitting layer 74. On the charge injecting/transporting layer 73, a bank 76 for partitioning the light-emitting layer 74 is arranged in such a way that openings 76a having an elliptical shape as viewed in plan are arrayed on the lower electrode 72. The light-emitting layer 74 is arranged to be surrounded on all four sides by the bank 76 having the elliptical openings 76a. The bank 76 is made of a fluorine-containing resin. The light-emitting layer 74 is a blue light-emitting layer of a polyfluorene compound. On the light-emitting layer 74 and the bank 76, an upper electrode 77, which is a calcium-aluminum multilayer film, is arranged on the entire substrate 71 in a region where the bank is arranged and in the region 78 surrounded by the bank. Thus, the EL element 70 is formed. The upper electrode 77 covers the light-emitting layer 74 and the bank 76.

A production method of the organic EL display device in accordance with Embodiment 7 is mentioned below.

An ITO (indium tin oxide) film was formed on the glass substrate 71 to have a thickness of 150 nm. This ITO film was patterned into a stripe pattern by photolithography to form the lower electrode 72. A glass substrate was used as the substrate 71, but not limited thereto. A quartz or plastic substrate, or the like, may be used.

The glass substrate 71 on which the lower electrode 72 had been formed, was rinsed by wet process with isopropyl alcohol, acetone, purified water, and the like, and then provided with a lyophilic treatment by oxygen plasma treatment. According to the oxygen plasma treatment, oxygen atoms are bonded or adhere to the glass substrate surface, and as a result, hydrogen bonding easily occurs and the glass substrate surface can be rinsed. Such a lyophilic treatment could be uniformly provided for the entire glass substrate 71 surface on which the lower electrode 72 had been formed.

Then, a mixture aqueous solution of PEDOT and PSS was spin-coated on the glass substrate 71 on which the lower electrode 72 had been formed, and then, the substrate was dried by heating at 200° C. for 30 minutes. By this drying by heat treatment, the solvent into which PEDOT and PSS had been dispersed was removed, and as a result, the charge injecting/transporting layer 73 was formed.

Successively, a coating liquid containing FH-800ME and MIBK (methyl isobutyl ketone) in a ratio of 3:7, FH-800ME being a lyophobic UV curable resin DEFENSA FH-800ME (product of DIC Corp.), was spin-coated on the glass substrate 71 on which the charge injecting/transporting layer 73 had been formed. Then, through a photomask having light-shielding portions having an elliptical shape as viewed in plane, the glass substrate 71 region was exposed to UV ray at 500 mJ/cm² with a high pressure mercury lamp, and then an uncured portion (a portion not exposed to UV ray) of the UV curable resin was removed by rinse with MEK (methyl ethyl ketone). Thus, the bank 76 was completed. According to this embodiment, the bank 76 having a fine pattern was formed without damaging the charge injecting/transporting layer 73. The bank 76 had a contact angle of 50° with respect to anisole and sufficiently exhibited lyophobicity to the light-emitting layer 74 material to be applied by an ink-jet process.

Then, the same liquid material as used in Embodiment 1, which contains a nonpolar solvent such as xylene and the polyfluorene compound shown in the above formula (3) dissolved, was pattern-applied with an ink-jet apparatus in the region 78 (the opening 76a) surrounded by the bank 76. After the pattern application, the solvent was removed. Thus, the blue light-emitting layer 74 was formed. Thereon, the upper electrode 77, which was a calcium-aluminum multilayer, was formed as a cathode electrode, and then a glass cap was arranged for sealing. As a result, the EL element 70 was completed.

Embodiment 8

FIG. 10 is a cross-sectional view schematically showing a configuration of an organic EL display device in accordance with Embodiment 8. The schematic plan view of the organic EL display device of Embodiment 8 is omitted because it has the same planar shape as in the organic EL display device of Embodiment 7, shown in FIG. 9(a).

The organic EL display device in accordance with Embodiment 8 has the same configuration as in Embodiment 7, except that an intermediate layer is arranged between the charge injecting/transporting layer, and the bank and the light-emitting layer. On a substrate 81, a lower electrode 82 of ITO is arranged into a stripe pattern. Thereon, a charge injecting/transporting layer 83 of PEDOT-PSS and an intermediate layer 85 of a triphenylamine compound are arranged in this order in the entire substrate 81 region. On the intermediate layer 85, a bank 86 of a fluorine-containing compound is arranged in such a way that openings having an elliptical shape as viewed in plane are arrayed to form a region 88 surrounded by the bank. In the region surrounded by the bank 86 (opening of the bank 86), a blue light emitting layer 84 of a polyfluorene compound is arranged. On the light-emitting layer 84 and the bank 86, an upper electrode 87, which is a calcium-aluminum multi-layer, is arranged in the entire substrate region. Thus, an EL element 80 is completed. Thus, the upper electrode 87 covers the light-emitting layer 84 and the bank 86.

The intermediate layer 85 is formed by spin-coating a liquid material containing a nonpolar solvent such as xylene and a triphenyl amine compound dissolved therein and by drying it. The material for the intermediate layer 85 is not especially limited as long as it has a function of preventing charges transported through the light-emitting layer 84 from the upper electrode 87 from being injected into the charge injecting/transporting layer 83. If an upper electrode is a cathode electrode and a charge transported through a light-emitting layer from the upper electrode is an electron, examples of the material for the intermediate layer 85 include poly[(9,9-dioctylfluorenyl-2,7-diyl)-co-(1,4-ethylenylbenzene)], poly[(9,9-dihexylfluorenyl-2,7-diyl)-co-(9-ethyl-3, 6-carbazole)], and poly[(9,9-dihexylfluorenyl-2,7-diyl)-co-(2,5-p-xylene)]. These compounds are dissolved in a nonpolar solvent to be applied. It is preferable that the thickness of the intermediate layer 85 is not larger than half of the thickness of the light-emitting layer 84 from viewpoint of driving voltage. Use of the intermediate layer 85 allows a reduction in driving voltage of the EL element and an improvement in light-emitting efficiency. Further, the lifetime of the EL element can be improved, for example.

Embodiment 9

FIG. 11 is a cross-sectional view schematically showing a configuration of an organic EL display device in accordance with Embodiment 9. The schematic plan view of the organic EL display device of Embodiment 9 is omitted because it has the same planar shape as in the organic EL display device of Embodiment 7, shown in FIG. 9(a).

The organic EL display device in accordance with Embodiment 9 has the same configuration as in Embodiment 7, except that an intermediate layer is arranged between the charge injecting/transporting layer and the light-emitting layer in a region surrounded by the bank. On a substrate 91, a lower electrode 92 of ITO is arranged into a stripe pattern. Thereon, a charge injecting/transporting layer 93 of PEDOT-PSS is arranged in the entire substrate 91 region. On the charge injecting/transporting layer 93, a bank 96 of a fluorine-containing compound is arranged in such a way that openings having an elliptical shape as viewed in plane are arrayed to form a pixel region 98. In the region surrounded by the bank 96 (opening of the bank 96), an intermediate layer 95 with a thickness of 25 nm, made of a liquid material containing a nonpolar solvent such as xylene and a triphenyl amine compound dissolved therein, and a blue light-emitting layer 94 of a polyfluorene compound are arranged in this order. On the light-emitting layer 94 and the bank 96, an upper electrode 97, which is a calcium-aluminum multi-layer, is arranged in the entire substrate region. Thus, an EL element 90 is completed. Thus, the upper electrode 97 covers the light-emitting layer 94 and the bank 96.

The intermediate layer 95 is formed by pattern-applying a liquid material containing a nonpolar solvent such as xylene and a triphenyl amine compound dissolved therein in a region 98 surrounded by the bank 96 (opening of the bank 96) with an ink-jet apparatus. According to Embodiment 9, if a multi-color organic EL display device is produced, the intermediate layer can be provided with separate colors. So the thickness of the intermediate layer in each color can be optimally determined.

Configurations shown in FIGS. 12 and 13 are mentioned as the configuration where the intermediate layer is arranged in a region surrounded by the bank between the charge injecting/transporting layer and the light-emitting layer.

According to the configuration shown in FIG. 12, an insulator 99a is arranged just below the bank 96 and positioned to be within the bank 36 region as viewed in plane, and a charge injecting/transporting layer 93a is arranged in the region 98 surrounded by the bank 96 to overlap with an end of the bank 96 as viewed in plane. Thus, an EL element 90a is formed. In the EL element 90a, the insulator 99a is arranged to be adjacent to the charge injecting/transporting layer 93a in the same plane thereof and arranged just below the bank 96 so as not to be out of the bank 96 region as viewed in plane. As shown in FIG. 13, an insulator 99b is arranged just below some of the banks 96 and positioned to be within each bank 96 region as viewed in plane, and a charge injecting/transporting layer 93b is arranged jus below the bank 96 in an insulator 99b-free region and also arranged in the region 98 surrounded by the bank 96. Thus, an EL element 90b is completed. The insulator is arranged just below the bank, and thereby the layer arranged in a layer lower than the bank is partitioned. Thus, an effect of preventing cross-talk between the light-emitting regions can be exhibited. These devices in accordance with modified embodiments have the same plan view as in Embodiment 7. Examples of a way of forming these insulators 99a and 99b include a way of forming an inorganic insulating film (for example, a $SiO_2$ film) with a thickness of 100 nm on the lower electrode 92 formed on the substrate 91 with a sputtering apparatus and then patterning the inorganic insulating film. In this case, the charge injecting/transporting layers 93a and 93b may be applied between adjacent insulators 99a and 99b, respectively, with a nozzle coater, and the like, after the insulators 99a and 99b are formed.

Comparative Embodiment 5

FIG. 14 is a cross-sectional view schematically showing a configuration of an organic EL display device in accordance with Comparative Embodiment 5. The schematic plan view of the organic EL display device of Comparative Embodiment 5 is omitted because it has the same planar shape as in the organic EL display device of Embodiment 7, shown in FIG. 9(a).

The organic EL display device in accordance with Comparative Embodiment 5 has the same configuration as in Embodiment 7, except that the charge injecting/transporting layer is arranged not in a layer lower than the bank but in a layer lower than the light-emitting layer in a region surrounded by the bank. According to the organic EL display device of Comparative Embodiment 5, on a substrate 151, a lower electrode 152 is arranged, and thereon, a bank 156 is formed to give a region 158 surrounded by the bank. On the lower electrode 152 arranged in the region 158 surrounded by the bank 156 (opening of the bank 156), a charge injecting/transporting layer 153 of PEDOT-PSS with a thickness of 70 nm and a light-emitting layer 154 of a polyfluorene compound with a thickness of 80 nm are arranged in this order. On the light-emitting layer 154, an upper electrode 157, which is a calcium-aluminum multi-layer film, is arranged in the entire display region. Thus, an EL element 150 is formed. According to Comparative Embodiment 5, a liquid material for the charge injecting/transporting layer is applied by an ink-jet process to give the charge injecting/transporting layer 153.

Comparative Embodiment 6

FIG. 15 is a cross-sectional view schematically showing a configuration of an organic EL display device in accordance with Comparative Embodiment 6. The schematic plan view of the organic EL display device of Comparative Embodiment 6 is omitted because it has the same planar shape as in the organic EL display device of Embodiment 7, shown in FIG. 9(a).

The organic EL display device in accordance with Comparative Embodiment 6 has the same configuration as in Comparative Embodiment 5, except that an intermediate layer is arranged between the charge injecting/transporting layer and the light-emitting layer in a region surrounded by the bank. According to the organic EL display device of Comparative Embodiment 6, a lower electrode 162 is arranged on a substrate 161, and thereon, a bank 166 is formed to give a region 168 surrounded by the bank. On the lower electrode 162 arranged in the region 168 surrounded by the bank 166 (opening of the bank 166), a charge injecting/transporting layer 163 of PEDOT-PSS with a thickness of 70 nm, an intermediate layer 165 of a triphenylamine compound with a thickness of 25 nm, and a light-emitting layer 164 of a polyfluorene compound with a thickness of 80 nm are arranged in this order. On the light-emitting layer 164, an upper electrode 167, which is a calcium-aluminum multi-layer film, is arranged in the entire display region. Thus, an EL element 160 is formed. According to Comparative Embodiment 6, liquid materials for the charge injecting/transporting layer and the intermediate layer are applied by an ink-jet process to give the charge injecting/transporting layer 163 and the intermediate layer 165.

Evaluation Results of Defect Rate

The organic EL display devices of Embodiments 7 to 9 and Comparative Embodiments 5 and 6 were measured for leakage current value. Based on it, a defect rate was calculated. A hundred of devices, each of Embodiments and Comparative Embodiments, were subjected to the measurement. A device showing a current density of $5.0 \times 10^{-5}$ $mA/cm^2$ or higher by application of a voltage of 1V between the lower and upper electrodes of the organic EL element was evaluated as a defect. The following Table 2 shows evaluation results of the defect rate. The device having a configuration shown in FIG. 11 was used for measurement as a device of Embodiment 9.

TABLE 2

|  | Defect rate |
|---|---|
| Embodiment 7 | 4% |
| Embodiment 8 | 5% |
| Embodiment 9 | 16% |
| Comparative Embodiment 5 | 75% |
| Comparative Embodiment 6 | 92% |

As shown in the results of Table 2, the defect rates of the organic EL display devices of Embodiments 7 to 9 are 4%, 5%, and 16%, respectively, and the defect rates of the organic EL display devices of Comparative Embodiments 5 and 6 are 75% and 92%, respectively. This shows that the defect rate can be significantly reduced in the organic EL display devices of Embodiments 7 to 9. According to Embodiments 7 to 9, the charge injecting/transporting layer is arranged in a layer lower than the bank, and thereby the liquid material for the charge injecting/transporting layer can be prevented from spreading on a side surface of the bank. Further, the charge injecting/transporting layer is formed before the bank is formed, and thereby the liquid material for the charge injecting/transporting layer can be prevented from adhering to the side surface of the bank. This could suppress an electric field applied into the light-emitting layer from being locally concentrated in a part of the layer, which would result in a reduction in leakage current. The present invention can provide an organic EL display device that has a reduced leakage current when a low voltage is applied and is excellent in light-emitting efficiency and lifetime.

In Embodiment 8 where both of the charge injecting/transporting layer and the intermediate layer are arranged in a layer lower than the bank, the defect rate is 5%. In Embodiment 9 where the charge injecting/transporting layer is arranged in a layer lower than the bank and the intermediate layer is partitioned by the bank, the defect rate is 16%. This shows that also when the other organic layers such as the intermediate layer are arranged in a layer lower than the bank, the advantages of the present invention can be sufficiently exhibited.

Comparisons between Embodiments 8 and 9, and between Comparative Embodiments 5 and 6 show that the defect rate increases as the number of the pattern-application for the region between the banks is increased. Specifically, from viewpoint of reducing the leakage current, as shown in Embodiments 7 and 8, it is preferable that only an organic material for the light-emitting layer among the organic materials for the EL element is applied in a region partitioned by the bank. This can prevent a liquid material discharged from a head of an ink-jet apparatus from changing its trajectory to be splashed into a non-target region, in the layers other than the light-emitting layer. As a result, a leakage current can be more suppressed, which leads to a decrease in defect rate.

Embodiment 10

An organic EL display device in accordance with Embodiment 10 is produced in the same manner as in Embodiment 8, except that the UV curable resin is rinsed with ethyl acetate instead of MEK in the step of forming the bank. The light-emitting layer could be satisfactorily pattern-applied by an ink-jet apparatus. The completed display device provided light emission without any problems.

Embodiment 11

An organic EL display device in accordance with Embodiment 11 is produced in the same manner as in Embodiment 8, except that the UV curable resin is rinsed with N-methyl-2-pyrrolidone instead of MEK in the step of forming the bank. The light-emitting layer could be satisfactorily pattern-applied by an ink-jet apparatus. The completed display device provided light emission without any problems.

Embodiment 12

An organic EL display device in accordance with Embodiment 12 is produced in the same manner as in Embodiment 8, except that the UV curable resin is rinsed with diphenyl sulfide instead of MEK in the step of forming the bank. The light-emitting layer could be satisfactorily pattern-applied by an ink-jet apparatus. The completed display device provided light emission without any problems.

Embodiment 13

An organic EL display device in accordance with Embodiment 13 is produced in the same manner as in Embodiment 8, except that the UV curable resin is rinsed with xylene instead of MEK in the step of forming the bank. The light-emitting layer could be satisfactorily pattern-applied by an ink-jet apparatus. The completed display device provided light emission without any problems.

Embodiment 14

An organic EL display device in accordance with Embodiment 14 is produced in the same manner as in Embodiment 8, except that the UV curable resin is rinsed with tetrahydrofurane instead of MEK in the step of forming the bank. The light-emitting layer could be satisfactorily pattern-applied by an ink-jet apparatus. The completed display provided light emission without any problems.

Embodiment 15

An organic EL display device in accordance with Embodiment 15 is produced in the same manner as in Embodiment 8, except that the UV curable resin is rinsed with dichloroethane instead of MEK in the step of forming the bank. The light-emitting layer could be satisfactorily pattern-applied by an ink-jet apparatus. The completed display provided light emission without any problems.

Embodiment 16

An organic EL display device in accordance with Embodiment 16 is produced in the same manner as in Embodiment 8, except that the UV curable resin is rinsed with isopropanol instead of MEK in the step of forming the bank. The light-emitting layer could be satisfactorily pattern-applied by an ink-jet apparatus. The completed display provided light emission without any problems.

The organic EL display devices of Embodiments 7 to 16 were measured for an amount of the material for the bank (uncured UV curable resin) contained in the organic EL layer such as the light-emitting layer or the intermediate layer with LC-MAS (liquid chromatography-Mass Spectrometer). The measurement yields a value of 1000 to 0.1 ppm. As a result of this measurement, the UV curable resin residue in such an amount has no influences on characteristics of the light-emitting layer.

Comparative Embodiment 7

An organic EL display device in accordance with Comparative Embodiment 7 was produced in the same manner as in Embodiment 7, except that the bank was formed in the following manner. Lyophilic photoresist NPAR-502 (product of NISSAN CHEMICAL INDUSTRIES, LTD) was spin-coated on a glass substrate on which a charge injecting/transporting layer had been formed. Then, through a photomask having light-shielding portions having an elliptical shape as viewed in plane, the glass substrate region was exposed to UV ray at 100 mJ/cm$^2$ with a high pressure mercury lamp, and developed with TMAH (tetramethylammonium hydroxide aqueous solution). Thus, the bank was completed. The bank had a contact angle of 50° with respect to anisole and sufficiently exhibited lyophobicity to the light-emitting layer material to be applied by an ink-jet process. The bank of the present Comparative Embodiment had the same pattern as in Embodiment 7. Then, the light-emitting layer was pattern-formed with an ink-jet apparatus similarly in Embodiment 7. The light-emitting layer could be pattern-applied, but the display device of this Comparative Embodiment did not emit light. This is because the charge injecting/transporting layer (PEDOT/PSS) was dissolved to be eliminated at the TMAM development.

Comparative Embodiment 8

An organic EL display device in accordance with Comparative Embodiment 8 was prepared in the same manner as in Embodiment 9, except that the bank was formed in the following manner. Lyophilic photoresist NPAR-502 (product of NISSAN CHEMICAL INDUSTRIES, LTD.) was spin-coated on a glass substrate on which a charge injecting/transporting layer had been formed. Successively, through a photomask having light-shielding portions having an elliptical shape as viewed in plane, the glass substrate was exposed to UV ray at 100 mJ/cm$^2$ with a high pressure mercury lamp, and then developed with TMAH (tetramethylammonium hydroxide aqueous solution). Thus, the bank was completed. The bank had a contact angle of 50° with respect to anisole and sufficiently exhibited lyophobicity to the light-emitting layer material to be applied by an ink-jet process. The bank of the present Comparative Embodiment had the same pattern as in Embodiment 8. Then, the light-emitting layer was pattern-formed with an ink-jet apparatus similarly in Embodiment 8. The light-emitting layer could be pattern-applied, but the display device of the present Comparative Embodiment did not emit light. This is because the intermediate layer lost its functions by being altered by TMAH.

The light-emitting layer constituting the organic EL display device of the present invention may have a single layer- or multilayer-structure. Light-emitting materials for OLED (organic light emitting diode) can be used as the organic EL material. Examples of such a light-emitting material include, but not limited to, polymer light-emitting materials, precursors of polymer light-emitting materials, and low-molecular light-emitting materials. Examples of the polymer light-emitting materials include: poly(2-decyloxy-1,4-phenylene)(DO-PPP), poly[2,5-bis-[2-(N,N,N-triethyl ammonium)ethoxy]-1,4-phenyl-alto-1,4-phenylene]dibromide (PPP-NEt$^{3+}$), and poly[2-(2'-ethylhexyloxy)-5-methoxy-1,4-phenylenevinylene](MEH-PPV). Examples of the precursors of the polymer light-emitting materials include poly(p-phenylenevinylene) precursor (Pre-PPV), and poly(p-naphthalenevinylene) precursor (Pre-PNV). Examples of the low-molecular light-emitting materials include aromatic dimethylidyne compounds such as 4,4'-bis(2,2'-diphenylvinyl)-biphenyl (DPVBi), oxadiazole compounds such as 5-methyl-2-[2-[4-(5-methyl-2-benzoxazolyl)phenyl]vinyl] benz oxazole, triazole derivatives such as 3-(4-biphenyl)-1)-4-phenyl-5-t-butylphenyl-1,2,4-triazole (TAZ), styryl benzene compounds such as 1,4-bis(2-methystyryl)benzene, fluorescent organic materials such as thiopyrazine dioxide derivatives, benzoquinone derivatives, naphthoquinone derivatives, anthraquinone derivatives, diphenoquinone derivatives, and fluorenone derivatives, and fluorescent organic metal compounds such as azomethine-zinc complex, and (8-hydroxyquinolinato)aluminum complex (Alq$_3$). Examples of the polymer materials include poly(9,9-dioctylfluorene) (PDAF), poly-spiro(PS), poly(2-decyloxy-1,4-phenylene) DO-PPP, poly[2,5-bis-[2-(N,N,N-triethylammonium)ethoxy]-1,4-phenyl-alto-1,4-phenylene]dibromide (PPP-NEt$^{3+}$), poly[2-(2'-ethylhexyloxy)-5-methoxy-1,4-phenylenevinylene](MEH-PPV), poly[5-methoxy-(2-propanoxysulfonide)-1,4-phenylenevinylene](MPS-PPV), and poly[2,5-bis-(hexyloxy)-1,4-phenylene-(1-cyanovinylene)] (CN-PPV). Examples of the solvent in which the organic light-emitting materials are dissolved include methanol, ethanol, THF (tetrahydrofuran), chloroform, toluene, xylene, and trimethyl benzene. A leveling agent, a light-emitting assist agent, an additive, a charge transporting agent, a light-emitting dopant, etc., can be included in the light-emitting layer.

The material for the charge injecting/transporting material is not especially limited, and publicly known materials can be used, for example. Specific compounds are mentioned below, but the material for the charge injecting/transporting material is not especially limited thereto. As the material for the hole injecting/transporting layer, in addition to a mixture of PEDOT and PSS, examples of polymer materials include PVPTA 2:TBPAH, represented by the following formula (4) and Et-PTPDEK-TBPAH, represented by the following formula (5). Further, examples of low-molecular materials include aromatic tertiary amine compounds such as (1,1-bis [4-(di-p-tolyl)aminophenyl]cyclohexane) (TAPC) represented by the following formula (6), N,N'-bis-(3-methylphenyl)-N,N'-bis-(phenyl)-benzidine (TPD) represented by the following formula (7), 4,4',4''-tris (N-(3-methylphenyl) N-phenylamino)triphenylamine (m-MTDATA) represented by the following formula (8), 4,4'-bis[N-(naphthyl)-N-phenyl-amino]biphenyl (α-NPD) represented by the following formula (9), copper phthalocyanine (CuPc) represented by the following formula (10), and N,N'-di(naphthalene-1-yl)-N,N'-diphenyl-benzidine (NPD); porphyrin compounds, hydrazine compounds, quinacridone compounds, and styrylamine compounds. Further, polyaniline, poly(triphenylamine derivative), polyvinylcarbazole (PVCz), diphenoquinone derivatives, diphenyl dicyanoethylene derivatives, and tetracyano anthraquinodimethane derivatives are mentioned of the polymer material. Examples of precursors of polymer materials include poly(p-phenylenevinylene) precursors and poly (P-naphthalenevinylene) precursors. Examples of the electron-transporting material include: low-molecular materials such as oxadiazole derivatives, triazole-derivatives, benzoquinonederivatives, naphthoquinone derivatives, and fluorene derivatives; and polymer materials such as polyoxadiazole.

[Formula 4]

(4)

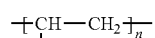
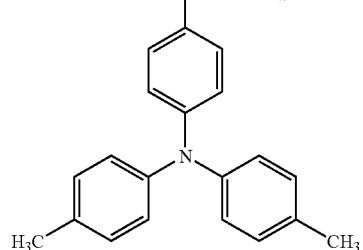
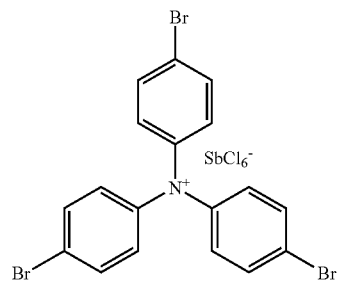

[Formula 5]

-continued
(5)
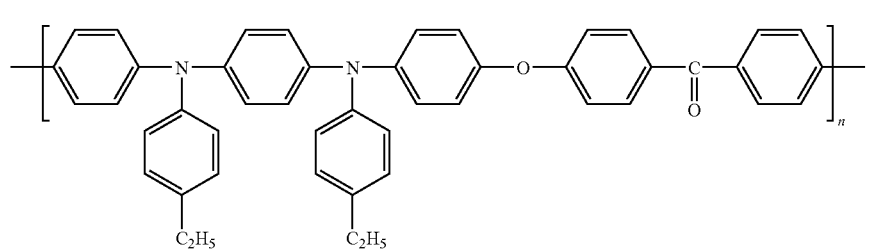
[Formula 6]
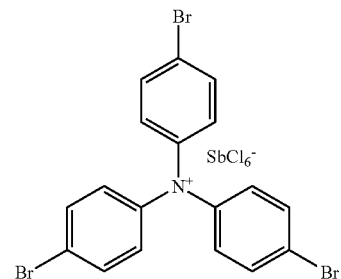
[Formula 7]
(6)
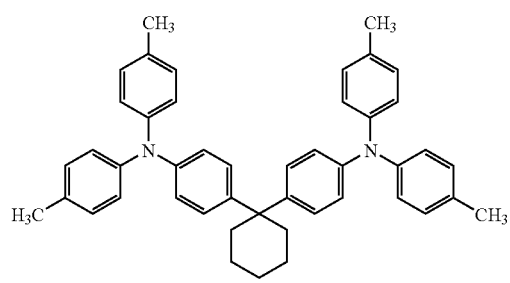
[Formula 8]
(7)
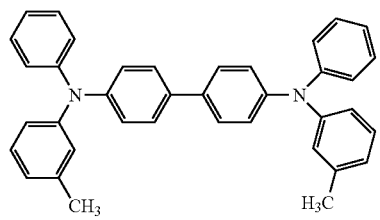
[Formula 9]
(8)
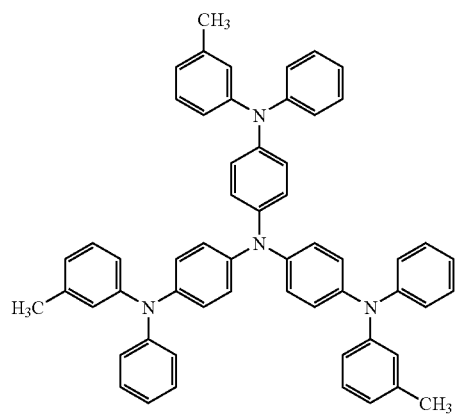
[Formula 10]
(9)
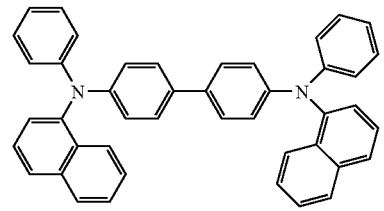
(10)
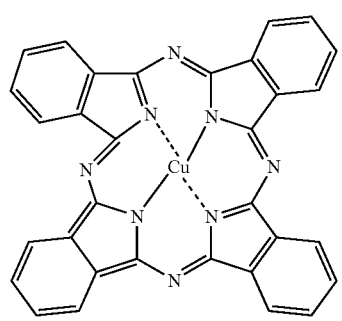

The present application claims priority to Patent Application No. 2007-255791 filed in Japan on Sep. 28, 2007 under the Paris Convention and provisions of national law in a designated State, the entire contents of which are hereby incorporated by reference.

Figure 1:
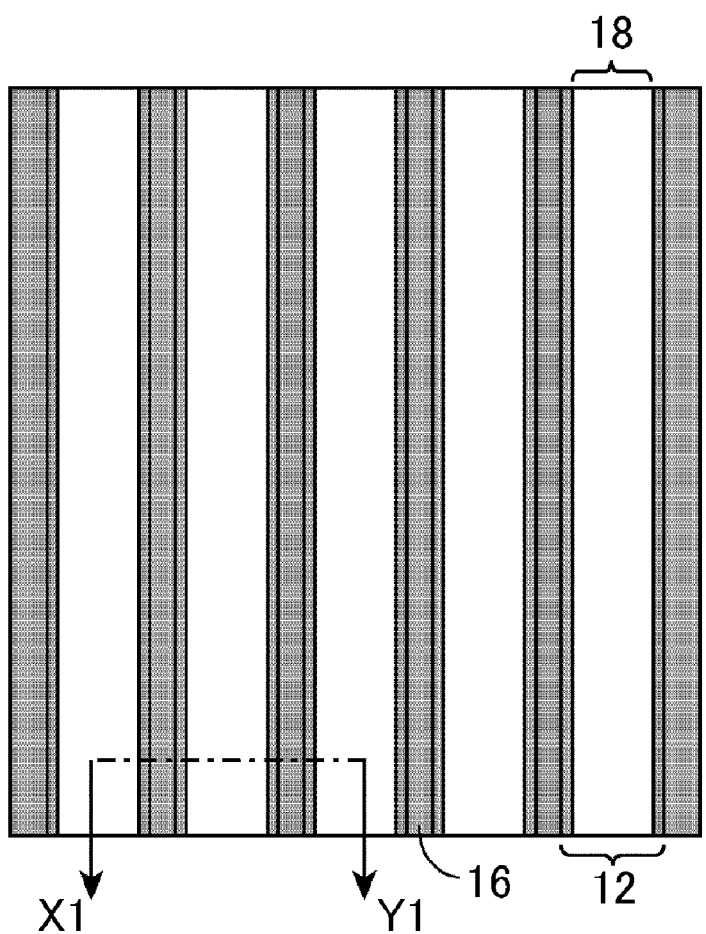
FIG. 1(a) is a schematic plan view of an organic EL display device in accordance with Embodiment 1.
FIG. 1(b) is a cross-sectional view taken along line X1-Y1 of FIG. 1(a).
Figure 1:
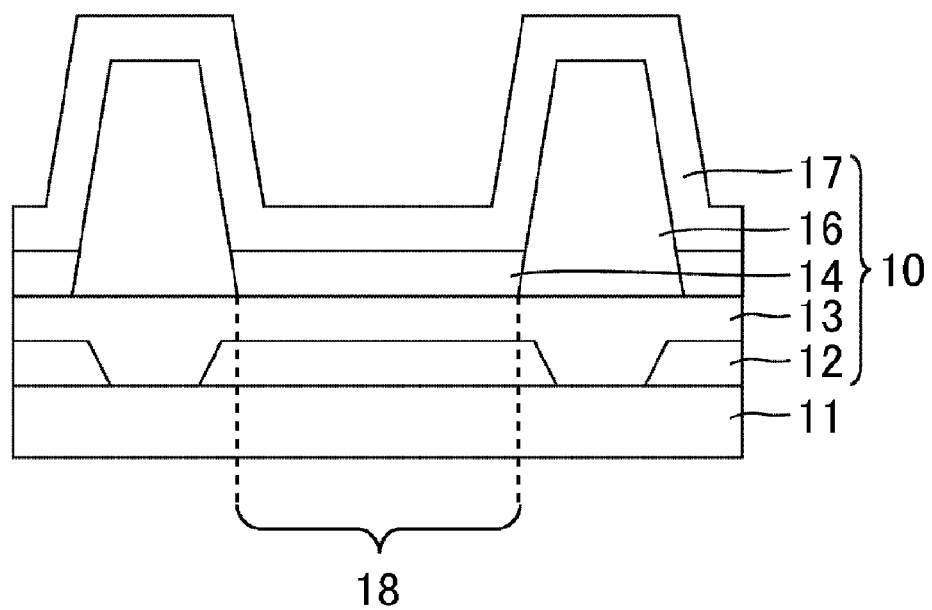
Figure 2:
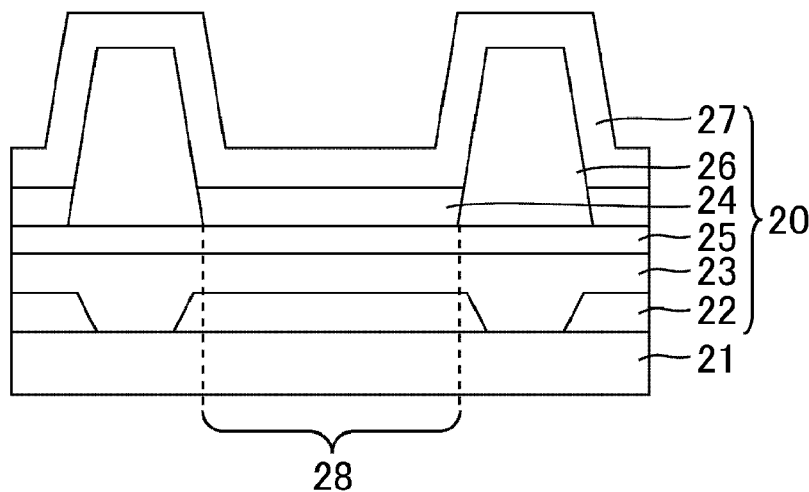
FIG. 2 is a cross-sectional view schematically showing a configuration of an organic EL display device in accordance with Embodiment 2.
Figure 3:
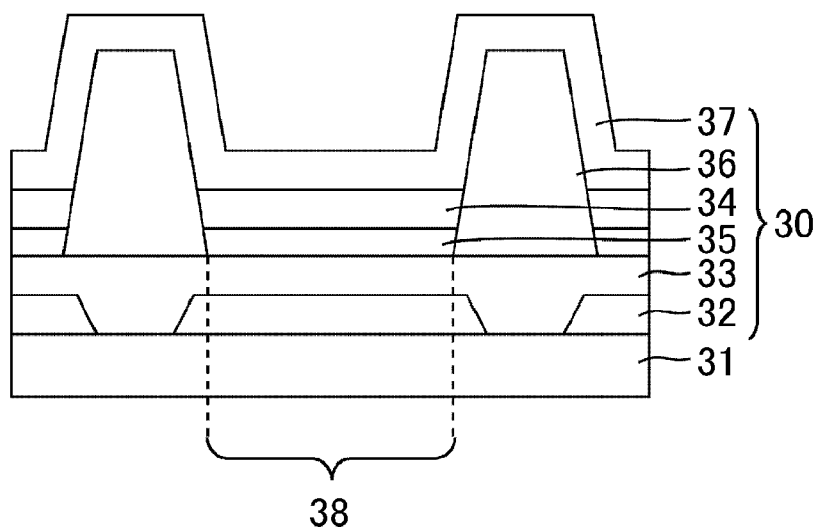
FIG. 3 is a cross-sectional view schematically showing a configuration of an organic EL display device in accordance with Embodiment 3.
Figure 4:
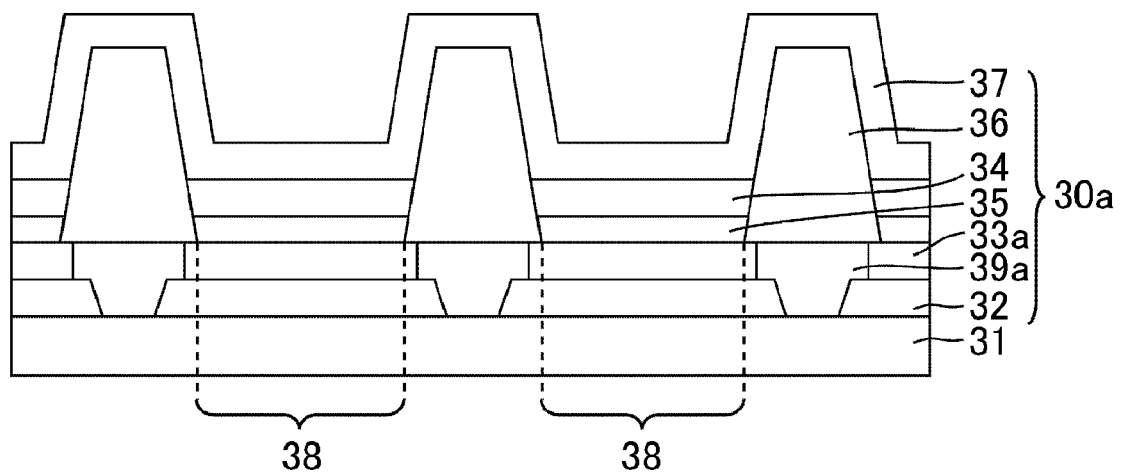
FIG. 4 is a cross-sectional view schematically showing another configuration of the organic EL display device in accordance with Embodiment 3.
Figure 5:
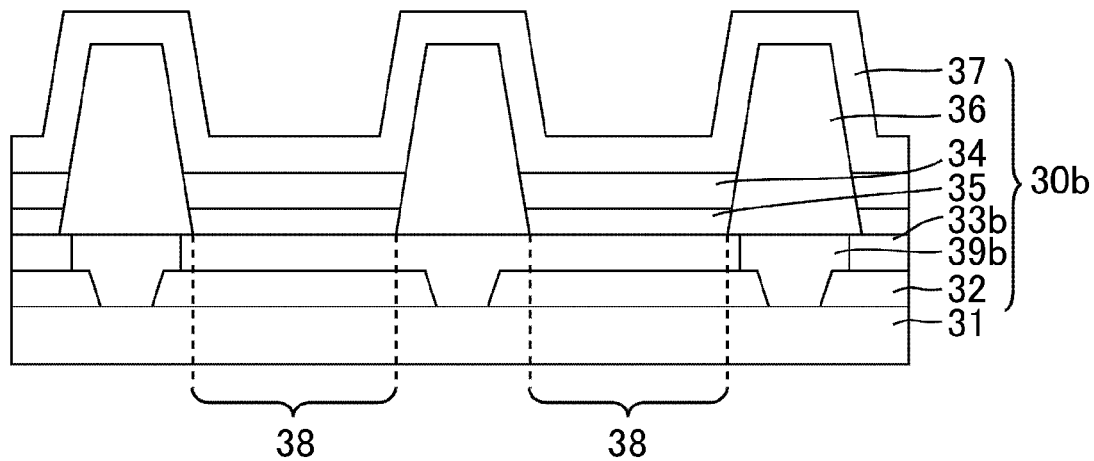
FIG. 5 is a cross-sectional view schematically showing another configuration of the organic EL display device in accordance with Embodiment 3.
Figure 6:
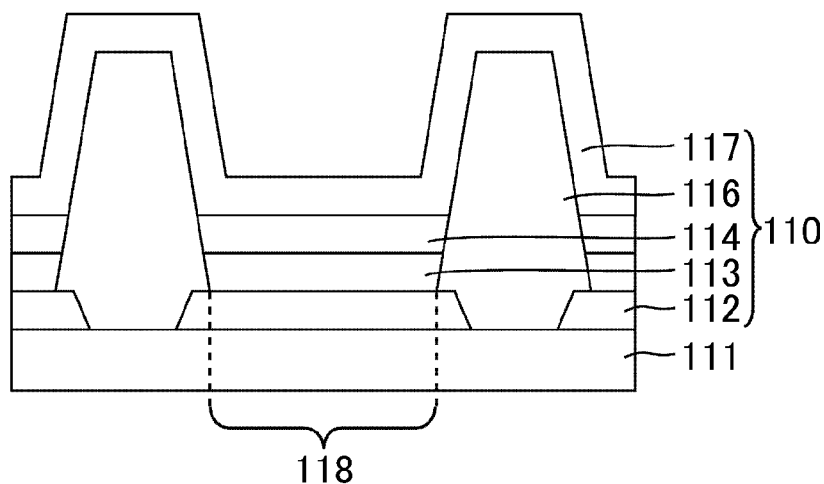
FIG. 6 is a cross-sectional view schematically showing a configuration of an organic EL display device in accordance with Comparative Embodiment 1.
Figure 7:
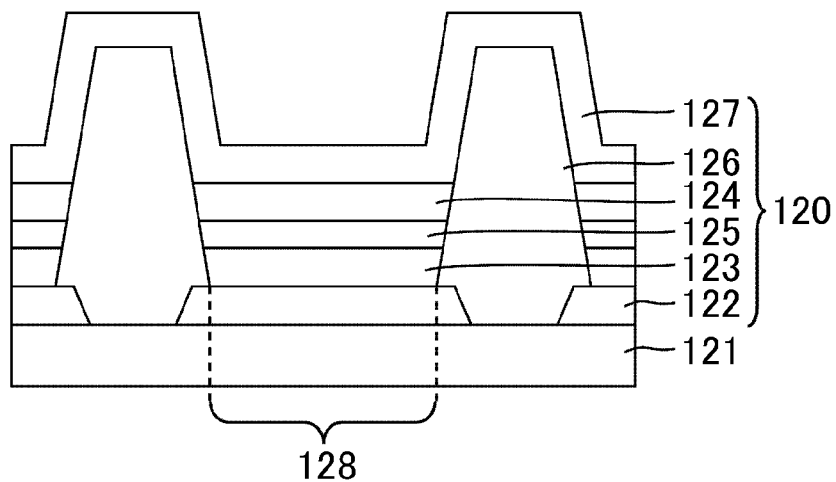
FIG. 7 is a cross-sectional view schematically showing a configuration of an organic EL display device in accordance with Comparative Embodiment 2.
Figure 8:
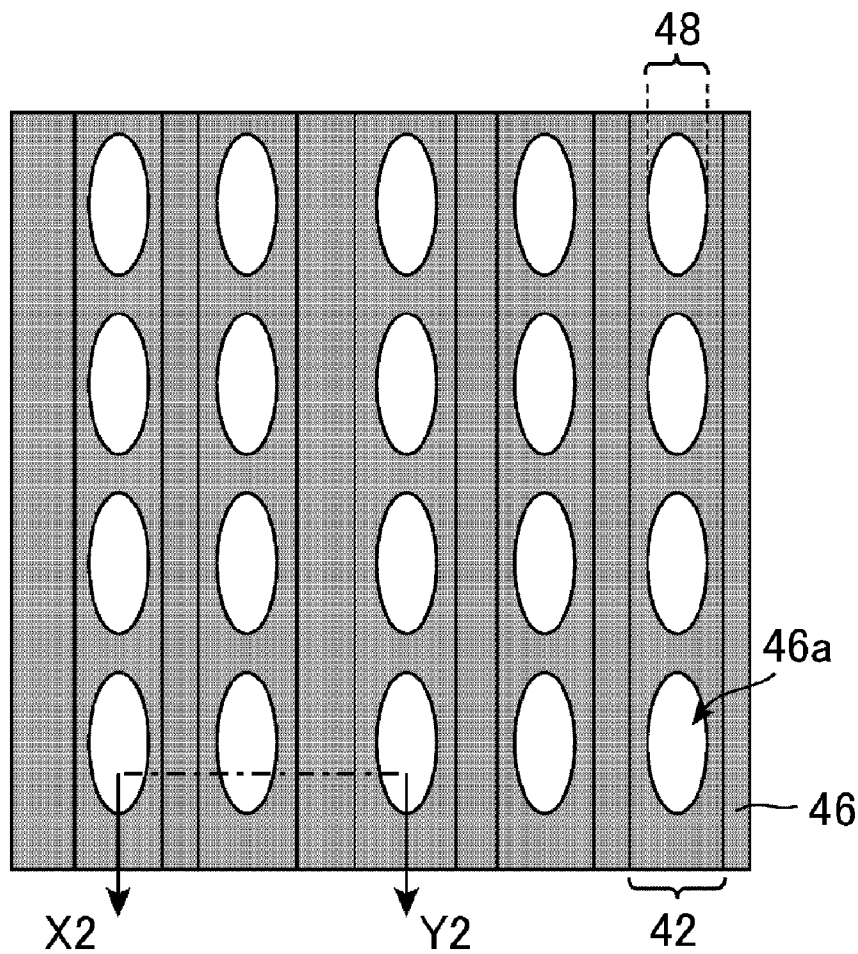
FIG. 8(a) is a schematic plan view of an organic EL display device in accordance with Embodiment 4.
FIG. 8(b) is a cross-sectional view taken along line X2-Y2 of FIG. 8(a).
Figure 8:
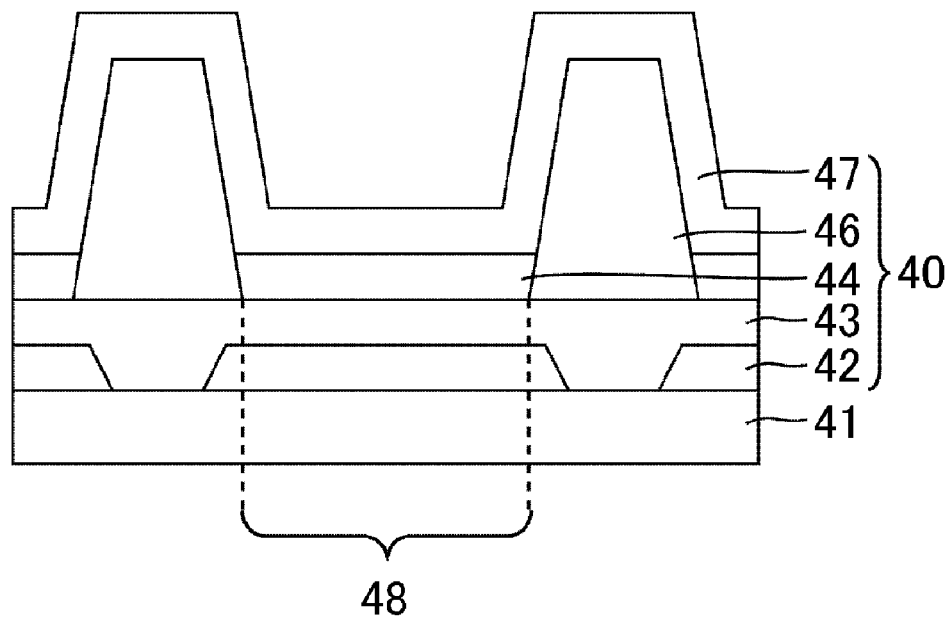
Figure 9:
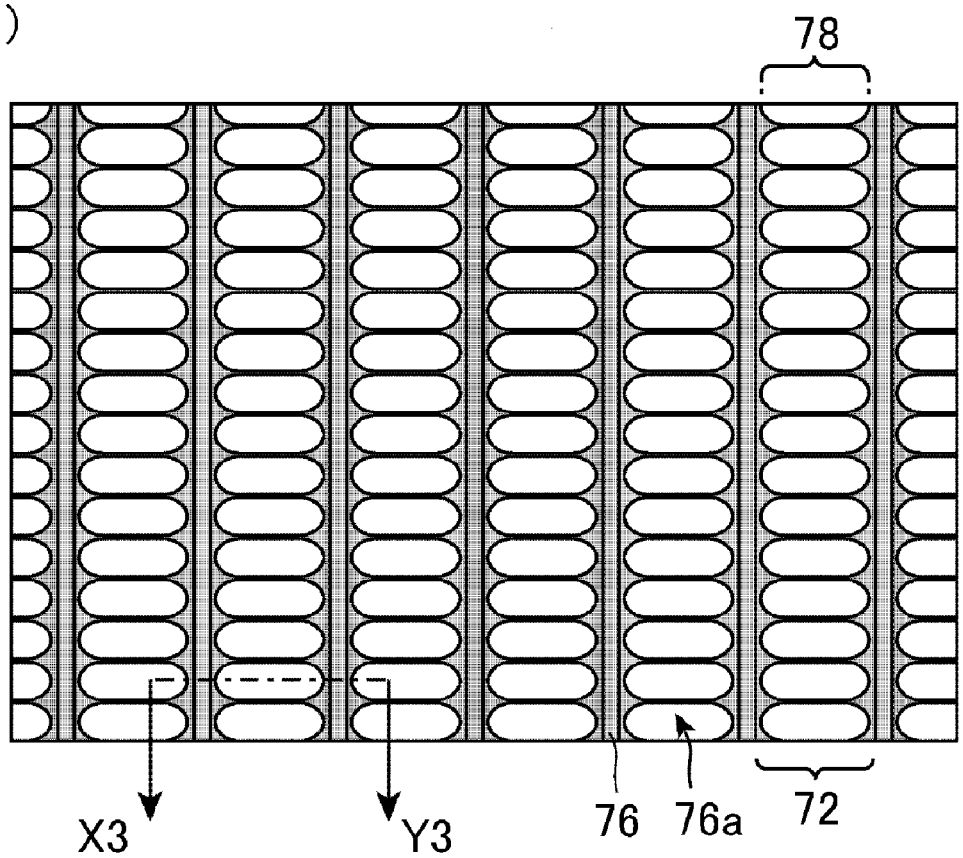
FIG. 9(a) is a schematic plan view of an organic EL display device in accordance with Embodiment 7.
FIG. 9(b) is a cross-sectional view taken along line X3-Y3 of FIG. 9(a).
Figure 9:
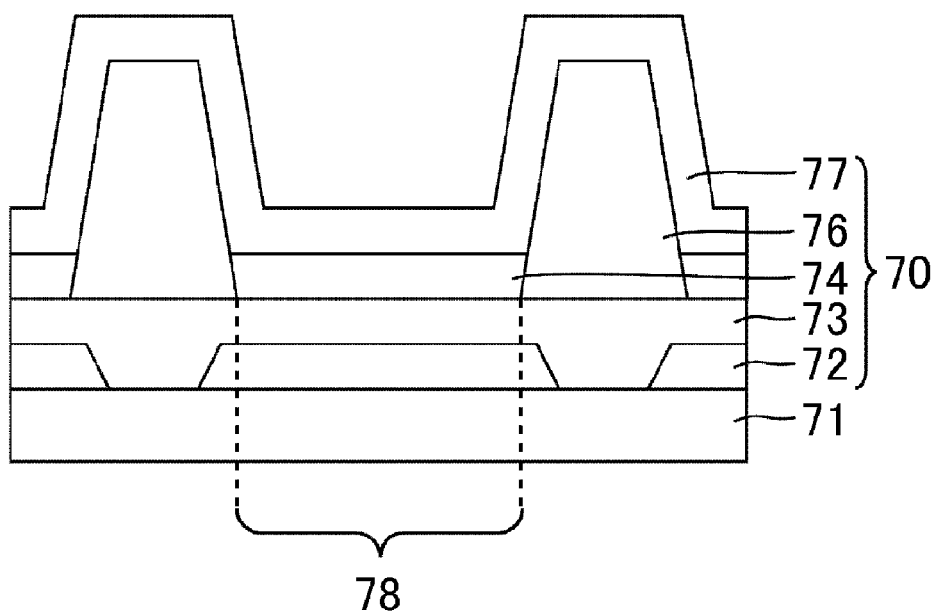
Figure 10:
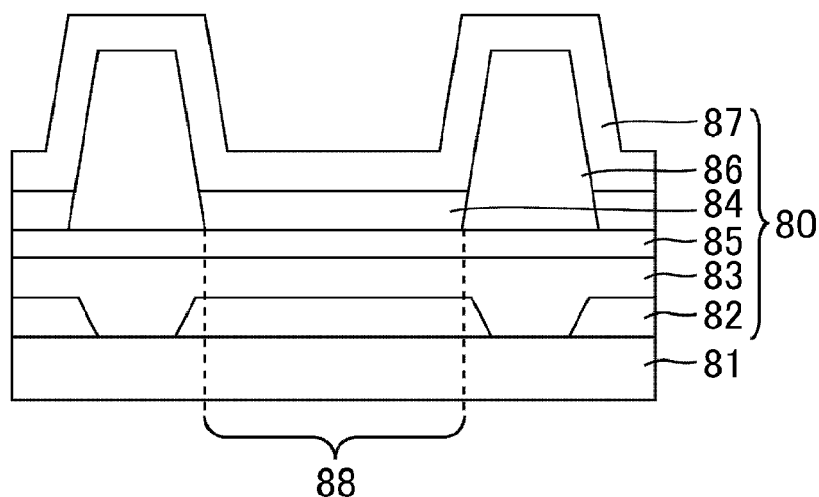
FIG. 10 is a cross-sectional view schematically showing a configuration of an organic EL display device in accordance with Embodiment 8.
Figure 11:
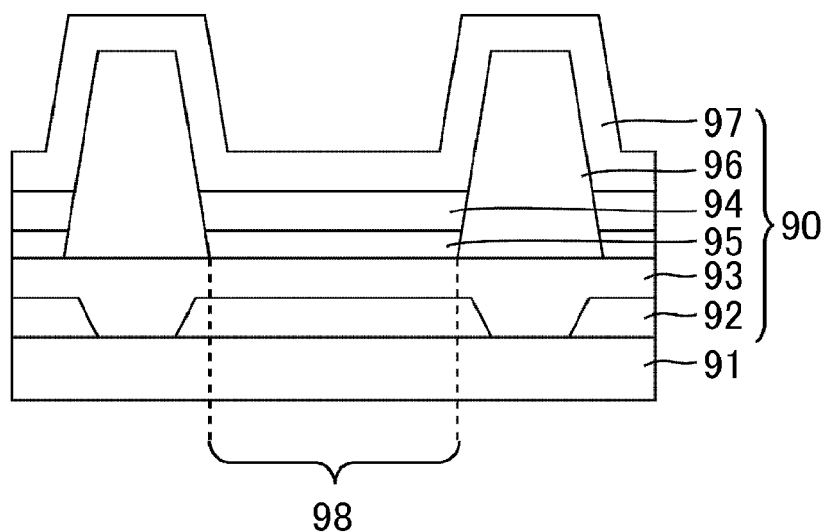
FIG. 11 is a cross-sectional view schematically showing a configuration of an organic EL display device in accordance with Embodiment 9.
Figure 12:
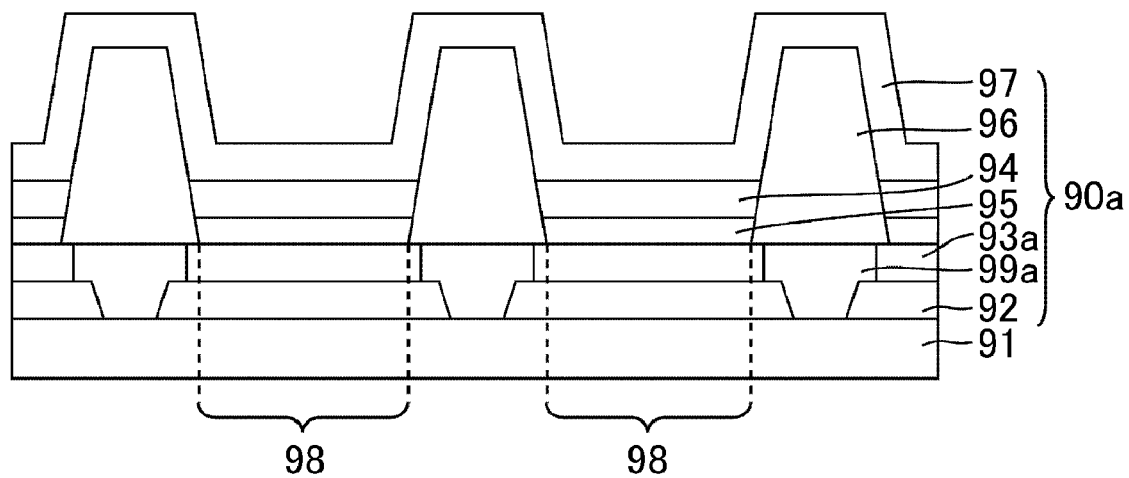
FIG. 12 is a cross-sectional view schematically showing another configuration of the organic EL display device in accordance with Embodiment 9.
Figure 13:
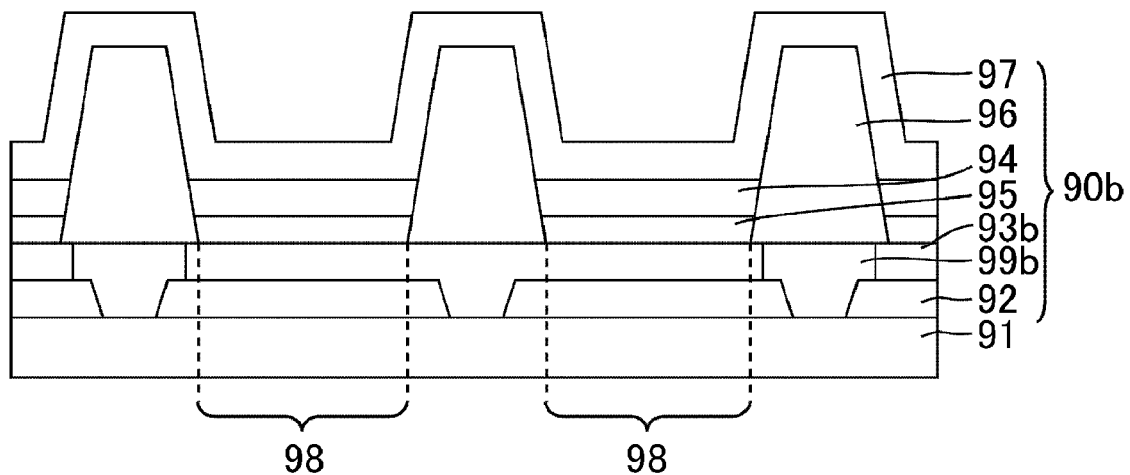
FIG. 13 is a cross-sectional view schematically showing another configuration of the organic EL display device in accordance with Embodiment 9.
Figure 14:
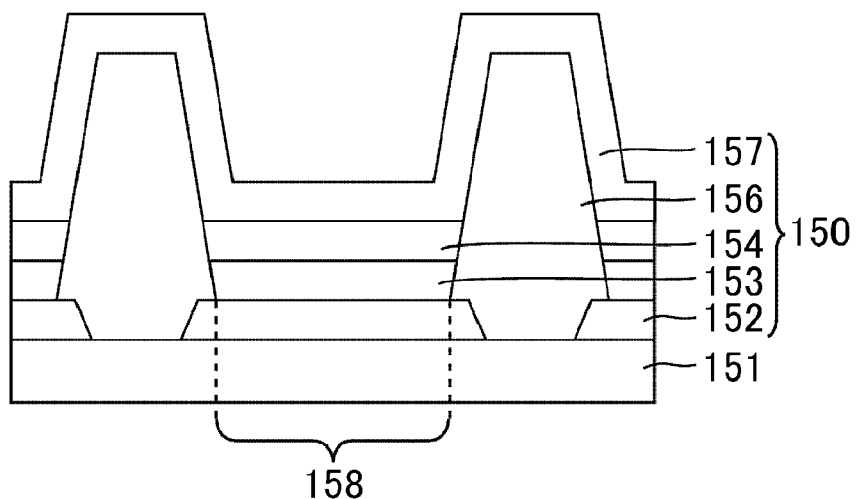
FIG. 14 is a cross-sectional view schematically showing a configuration of an organic EL display device in accordance with Comparative Embodiment 5.
Figure 15:
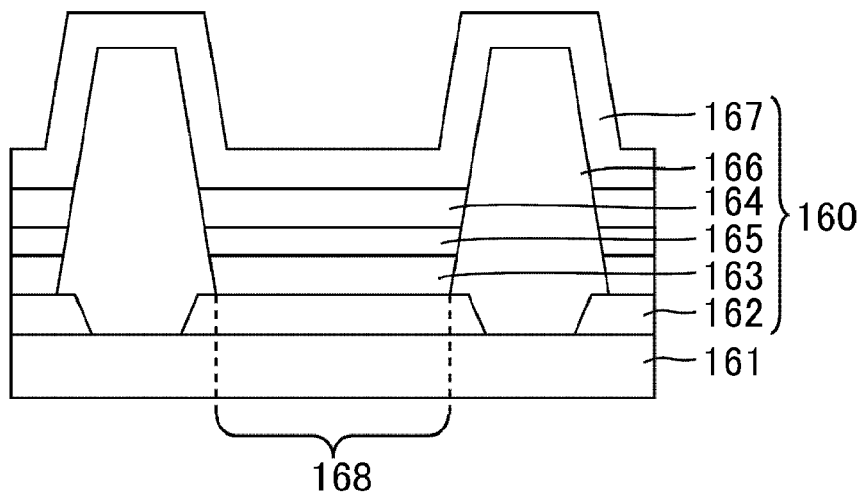
FIG. 15 is a cross-sectional view schematically showing a configuration of an organic EL display device in accordance with Comparative Embodiment 6.

EXPLANATION OF NUMERALS AND SYMBOLS 10, 20, 30, 30a, 30b, 40, 70, 80, 90, 90a, 90b, 110, 120, 150, 160: Electroluminescent element
11, 21, 31, 41, 71, 81, 91, 111, 121, 151, 161: Substrate
12, 22, 32, 42, 72, 82, 92, 112, 122, 152, 162: Lower electrode
13, 23, 33, 33a, 33b, 43, 73, 83, 93, 93a, 93b, 113, 123, 153, 163: Charge injecting/transporting layer
14, 24, 34, 44, 74, 84, 94, 114, 124, 154, 164: Light-emitting layer
25, 35, 45, 75, 85, 95, 115, 125, 165: Intermediate layer
16, 26, 36, 46, 76, 86, 96, 116, 126, 156, 166: Bank
46a, 76a: Opening
17, 27, 37, 47, 77, 87, 97, 117, 127, 157, 167: Upper electrode
18, 28, 38, 48, 78, 88, 98, 118, 128, 158, 168: Region surrounded by bank
39a, 39b, 99a, 99b: Insulating film

The invention claimed is:

1. An organic electroluminescent display device comprising an electroluminescent element,
the electroluminescent element comprising a lower electrode, an organic layer, a light-emitting layer, and an upper electrode, stacked one above the other on and above a substrate in this order, wherein
the organic electroluminescent display device further includes a bank arranged on the organic layer;
the organic layer is a charge injecting/transporting layer;
the organic electroluminescent display device further includes an intermediate layer arranged to block a carrier transferred from the upper electrode between the charge injecting/transporting layer and the light-emitting layer; and
the bank is arranged on and above the intermediate layer.

2. The organic electroluminescent display device according to claim 1,
wherein a layer that is arranged directly on and below the bank has a width larger than that of a region surrounded by the bank.

3. The organic electroluminescent display device according to claim 1,
wherein the bank is made of a material having a contact angle of 90° or larger with respect to water.

4. The organic electroluminescent display device according to claim 1,
wherein the bank is made of a material having a contact angle of 120° or smaller with respect to water.

5. The organic electroluminescent display device according to claim 1,
wherein the bank is made of a material having a contact angle of 30° or larger and 70° or smaller with respect to anisole.

6. A production method of the organic electroluminescent display device according to claim 1,
comprising the steps of:
forming the bank on and above the organic layer; and
forming the light-emitting layer with a coating apparatus.

7. The production method of the organic electroluminescent display device according to claim 6,
wherein the coating apparatus is an ink-jet apparatus.

8. A production method for the organic electroluminescent display device according to claim 1, the production method comprising:
a step of forming the bank by applying a photosensitive resin on and above the organic layer, pattern-exposing the photosensitive resin, and removing an uncured portion of the photosensitive resin with an organic solvent.

9. The production method of the organic electroluminescent display device according to claim 8,
where the photosensitive resin is a UV-curable resin.

10. The production method of the organic electroluminescent display device according to claim 8,
wherein the organic solvent comprises at least one selected from the group consisting of ketone solvents, ester solvents, nitrogen-containing organic solvents, sulfur-containing organic solvents, aromatic solvents, ether solvents, halogenated hydrocarbon solvents, and alcohol solvents.

* * * * *